US009502520B2

(12) United States Patent
Masuoka et al.

(10) Patent No.: US 9,502,520 B2
(45) Date of Patent: Nov. 22, 2016

(54) METHOD FOR PRODUCING SEMICONDUCTOR DEVICE AND SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

(21) Appl. No.: 14/805,767

(22) Filed: Jul. 22, 2015

(65) Prior Publication Data

US 2015/0325665 A1    Nov. 12, 2015

Related U.S. Application Data

(63) Continuation of application No. PCT/JP2013/066559, filed on Jun. 17, 2013.

(51) Int. Cl.
*H01L 29/423* (2006.01)
*H01L 29/66* (2006.01)
(Continued)

(52) U.S. Cl.
CPC ....... *H01L 29/42392* (2013.01); *H01L 21/306* (2013.01); *H01L 21/30625* (2013.01);
(Continued)

(58) Field of Classification Search
CPC ................................................ H01L 29/42392
See application file for complete search history.

(56) References Cited

U.S. PATENT DOCUMENTS 6,891,234 B1    5/2005 Connelly et al.
2003/0107133 A1    6/2003 Tomita
(Continued)

FOREIGN PATENT DOCUMENTS

JP    H02-071556 A    3/1990
JP    H02-188966 A    7/1990
(Continued)

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.
(Continued)

*Primary Examiner* — Yu-Hsi D Sun
(74) *Attorney, Agent, or Firm* — Brinks Gilson & Lione

(57) ABSTRACT

A method for producing a semiconductor device includes a first step of forming a fin-shaped semiconductor layer on a semiconductor substrate and forming a first insulating film around the fin-shaped semiconductor layer; a second step of forming a pillar-shaped semiconductor layer and a first dummy gate formed of a first polysilicon; a third step of forming a second dummy gate on side walls of the first dummy gate and the pillar-shaped semiconductor layer; a fourth step of forming a side wall formed of a fifth insulating film around the second dummy gate, forming a second diffusion layer in an upper portion of the fin-shaped semiconductor layer and a lower portion of the pillar-shaped semiconductor layer, and forming a metal-semiconductor compound on the second diffusion layer; a fifth step of forming a gate electrode and a gate line; and a sixth step of depositing a sixth insulating film, forming a third resist for forming a contact hole on the pillar-shaped semiconductor layer, etching the sixth insulating film to form a contact hole on the pillar-shaped semiconductor layer, removing the third resist, depositing a second gate insulating film, depositing a second metal, etching back the second metal, removing the second gate insulating film on the pillar-shaped semiconductor layer so as to form a metal side wall on a side wall of an upper portion of the pillar-shaped semiconductor layer, and depositing a third metal so as to form a contact that connects an upper portion of the metal side wall to an upper portion of the pillar-shaped semiconductor layer.

4 Claims, 42 Drawing Sheets

(51) Int. Cl.
- *H01L 29/40* (2006.01)
- *H01L 29/78* (2006.01)
- *H01L 21/311* (2006.01)
- *H01L 21/3213* (2006.01)
- *H01L 21/306* (2006.01)
- *H01L 21/3205* (2006.01)
- *H01L 21/8234* (2006.01)
- *H01L 27/088* (2006.01)

(52) U.S. Cl.
CPC .... *H01L21/31111* (2013.01); *H01L 21/31144* (2013.01); *H01L 21/32055* (2013.01); *H01L 21/32133* (2013.01); *H01L 21/823431* (2013.01); *H01L 21/823487* (2013.01); *H01L 27/0886* (2013.01); *H01L 29/401* (2013.01); *H01L 29/6681* (2013.01); *H01L 29/66545* (2013.01); *H01L 29/66719* (2013.01); *H01L 29/7802* (2013.01); *H01L 29/7851* (2013.01); *H01L 2029/7858* (2013.01)

(56) References Cited

U.S. PATENT DOCUMENTS

| | | | | |
|---|---|---|---|---|
| 2007/0284623 | A1* | 12/2007 | Kim et al. | H01L 27/0207 257/213 |
| 2008/0173937 | A1* | 7/2008 | Chung et al. | H01L 29/0657 257/329 |
| 2010/0210079 | A1 | 8/2010 | Masuoka et al. | |
| 2010/0264484 | A1 | 10/2010 | Masuoka et al. | |
| 2012/0049252 | A1 | 3/2012 | Masuoka et al. | |

FOREIGN PATENT DOCUMENTS

| | | |
|---|---|---|
| JP | H03-145761 A | 6/1991 |
| JP | 11-297984 A | 10/1999 |
| JP | 2003-179132 A | 6/2003 |
| JP | 2004-356314 A | 12/2004 |
| JP | 2009-182317 A | 8/2009 |
| JP | 2010-251678 A | 11/2010 |
| WO | WO 2009/110050 A1 | 9/2009 |
| WO | WO 2013/093988 A1 | 6/2013 |

OTHER PUBLICATIONS

Wu et al., "High Performance 22/20nm FinFET CMOS Devices with Advanced High-K/Metal Gate Scheme", IEEE, pp. 27.1.1-27.1.4, 2010.

International Search Report and Written Opinion with English Translation for PCT/JP2013/066559 dated Jul. 23, 2013, 11 pages.

English language translation of International Preliminary Report on Patentability for corresponding International Application No. PCT/JP2013/066559 dated Dec. 30, 2015, 8 pages.

* cited by examiner

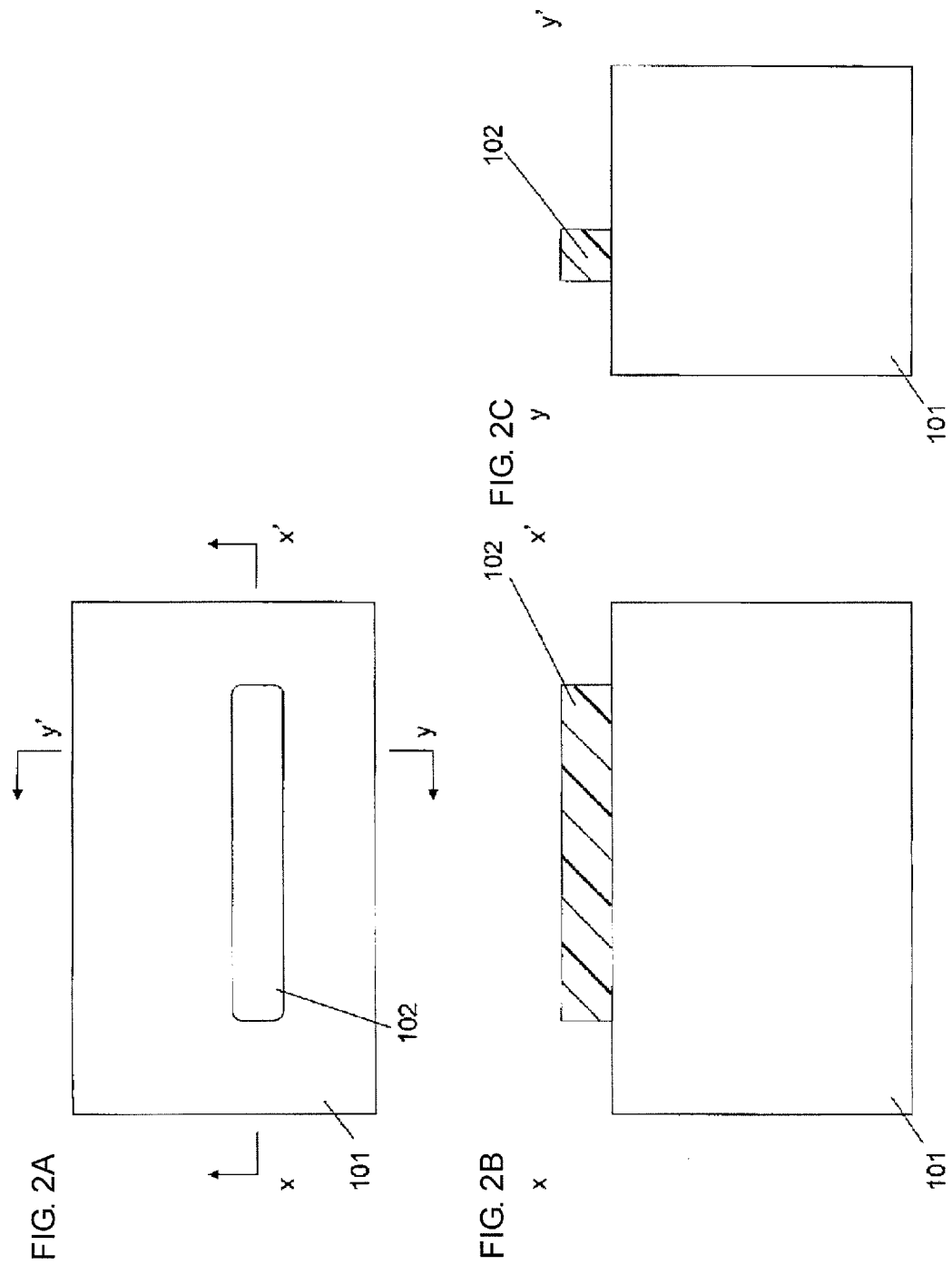

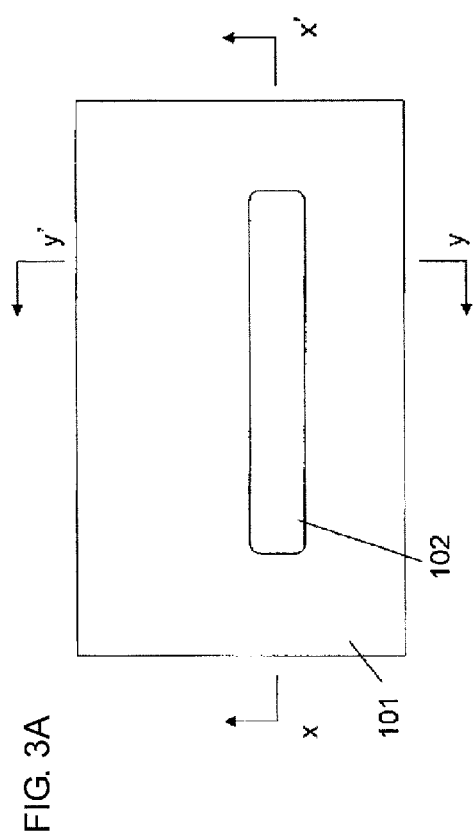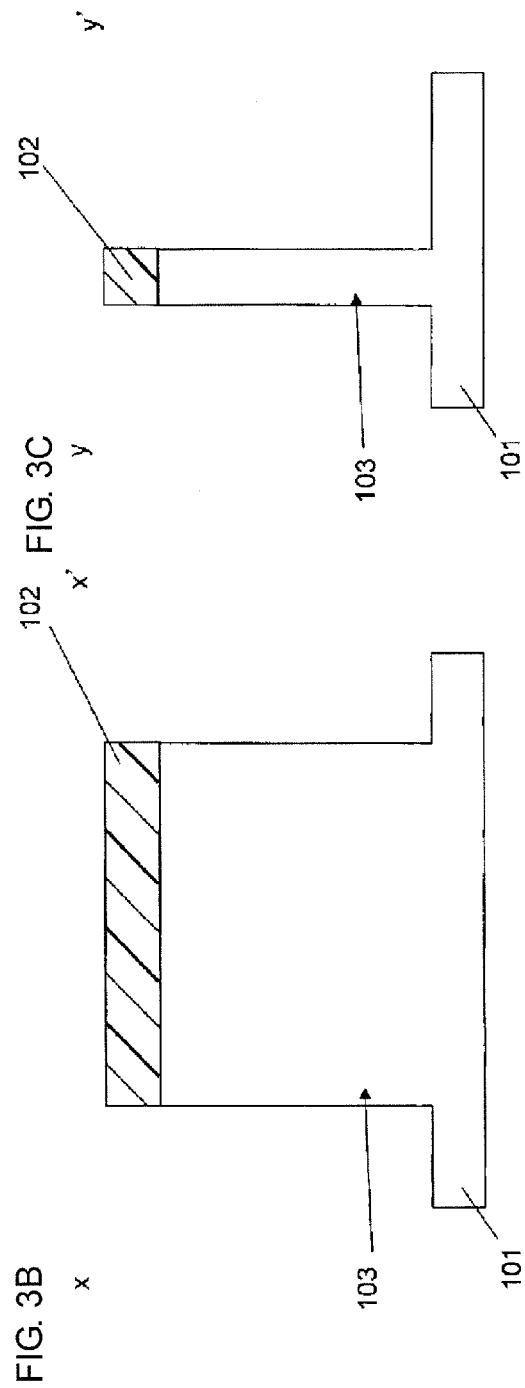

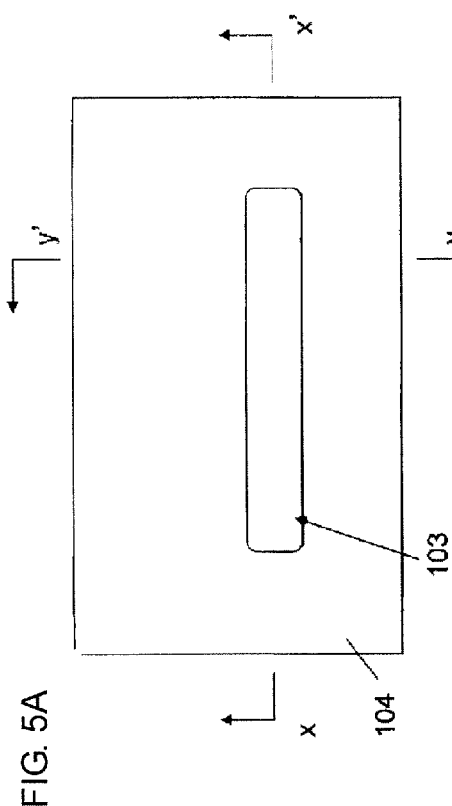
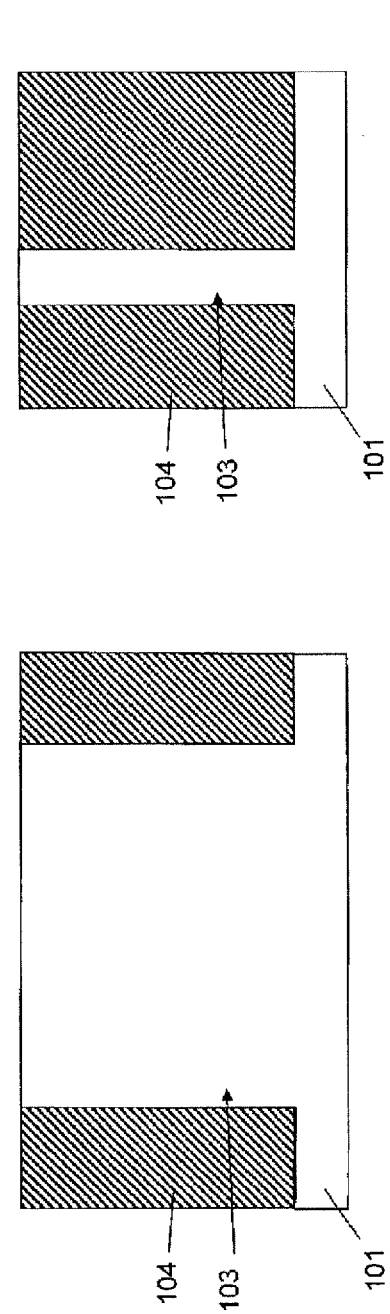
FIG. 5A
FIG. 5B
FIG. 5C

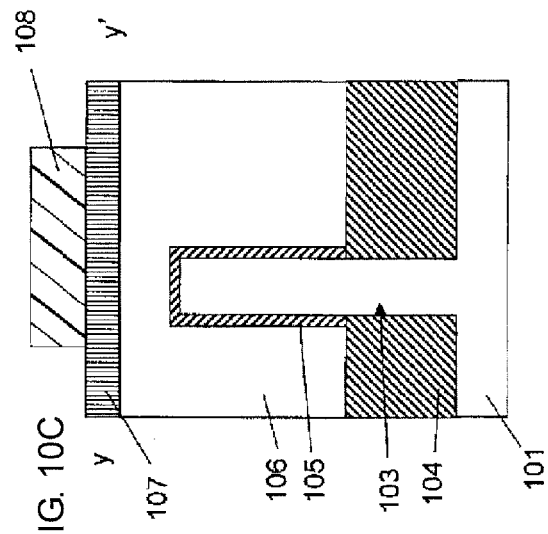
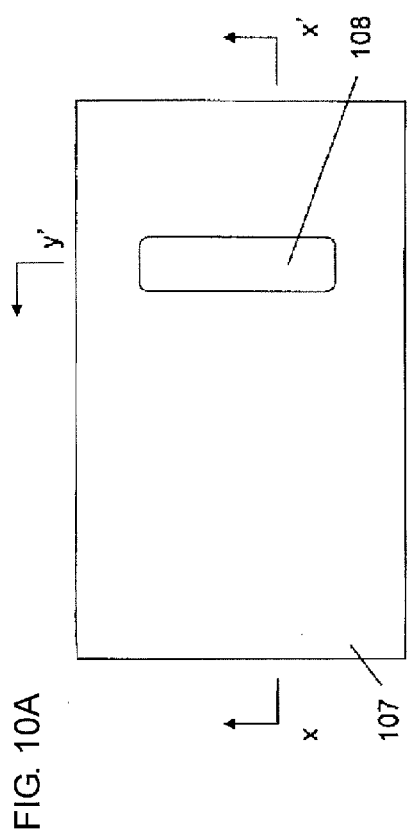
FIG. 10A
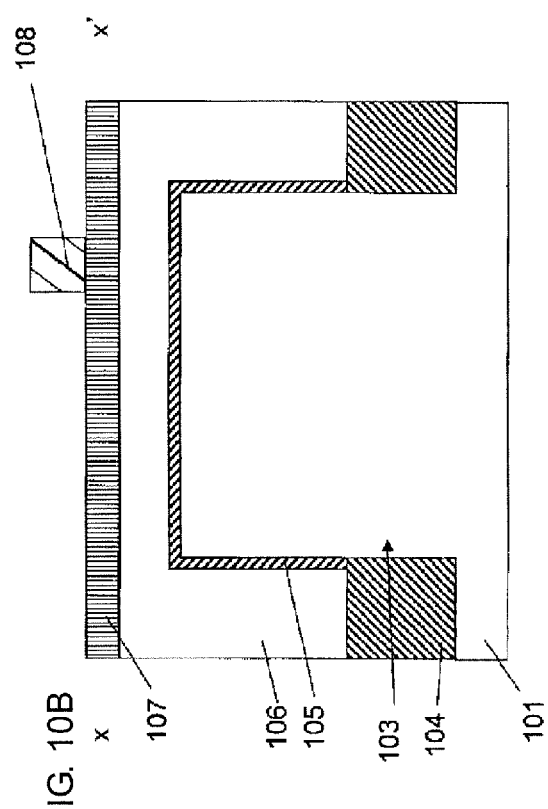
FIG. 10B
FIG. 10C

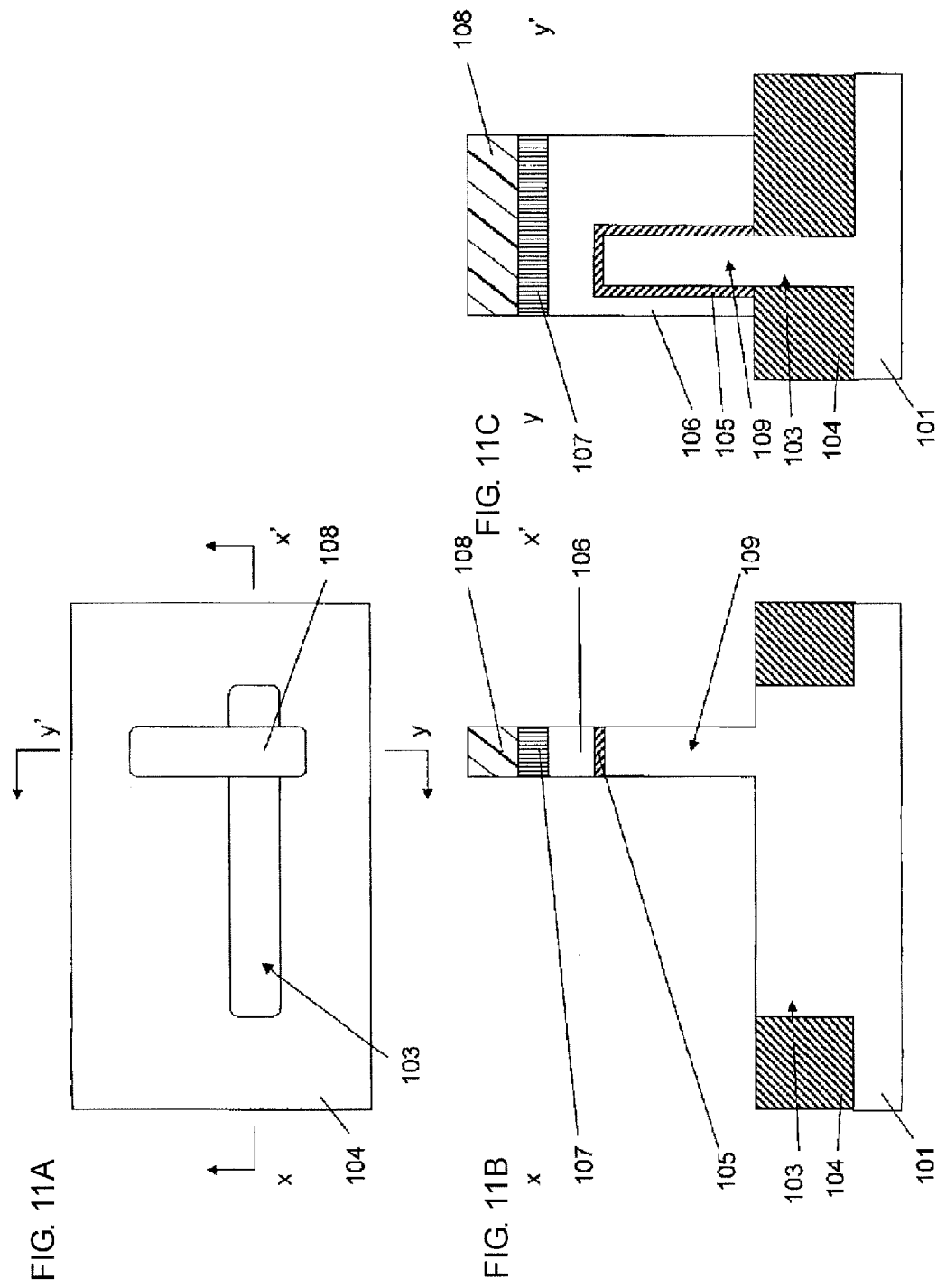

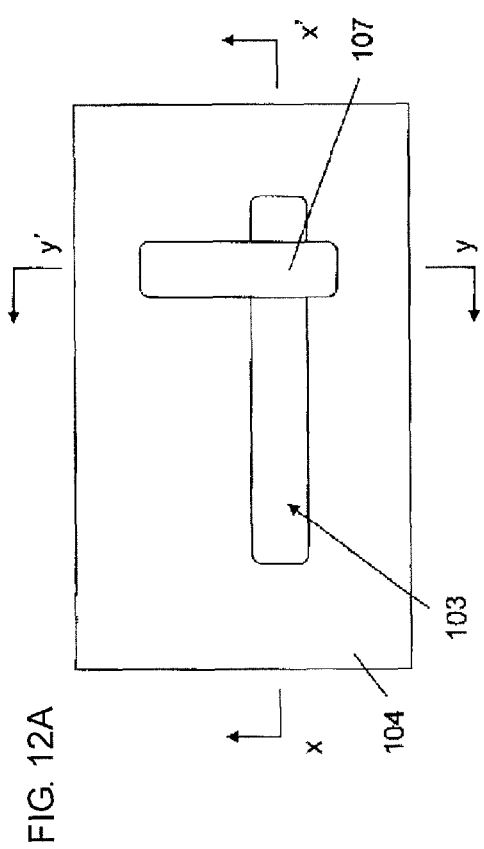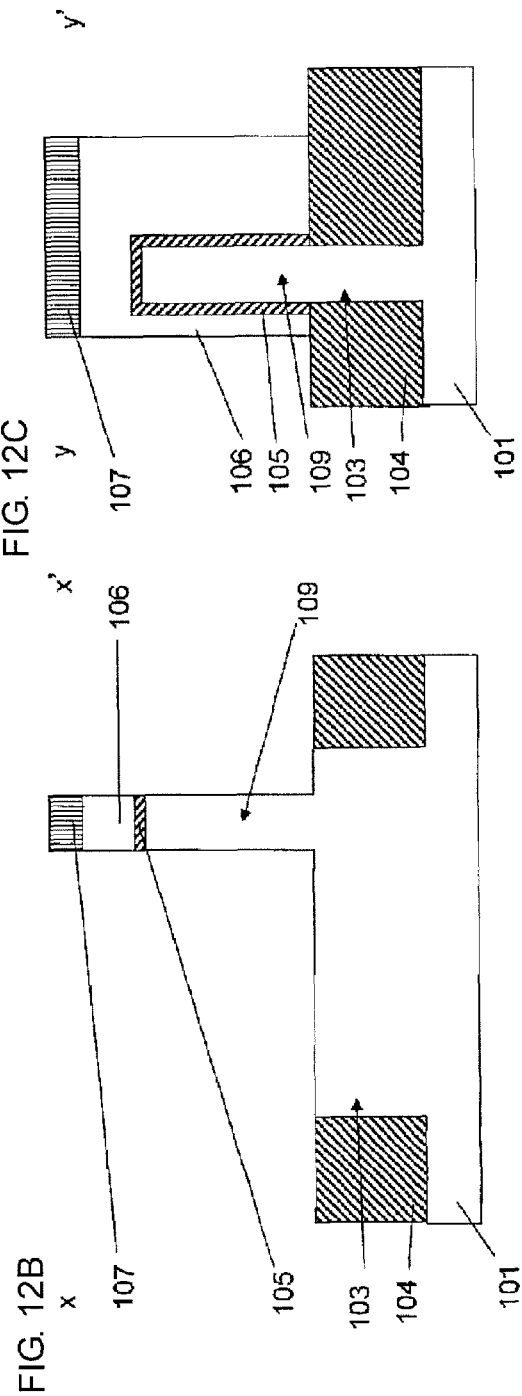

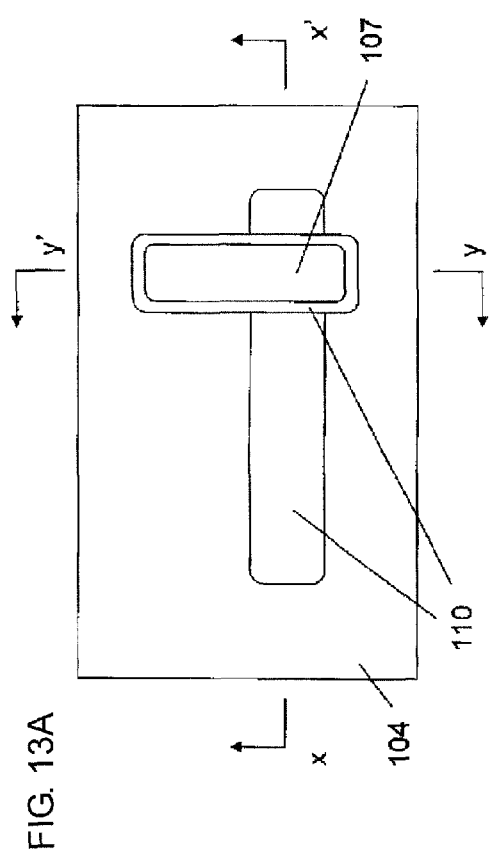
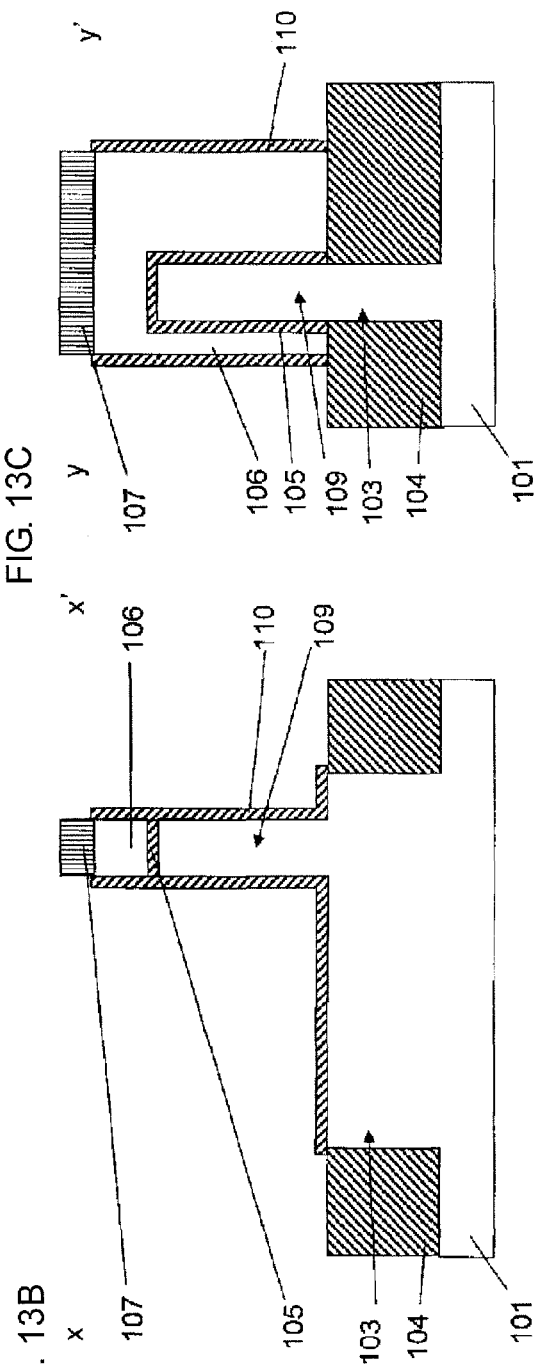
FIG. 13A
FIG. 13B
FIG. 13C

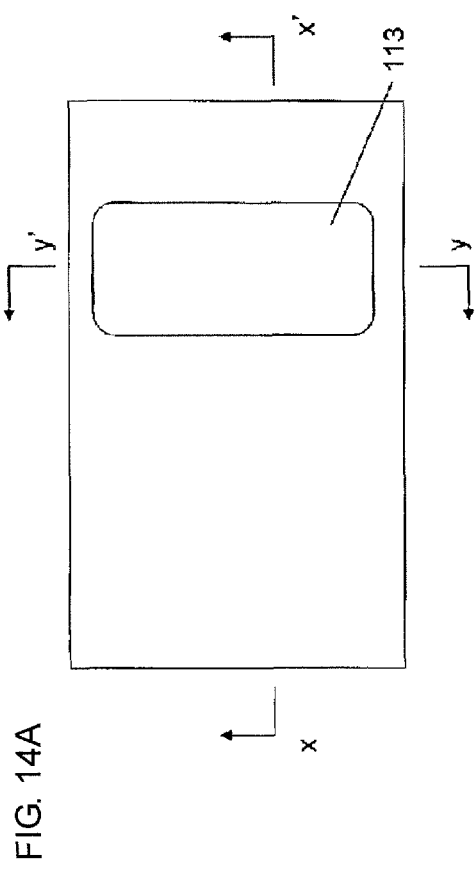
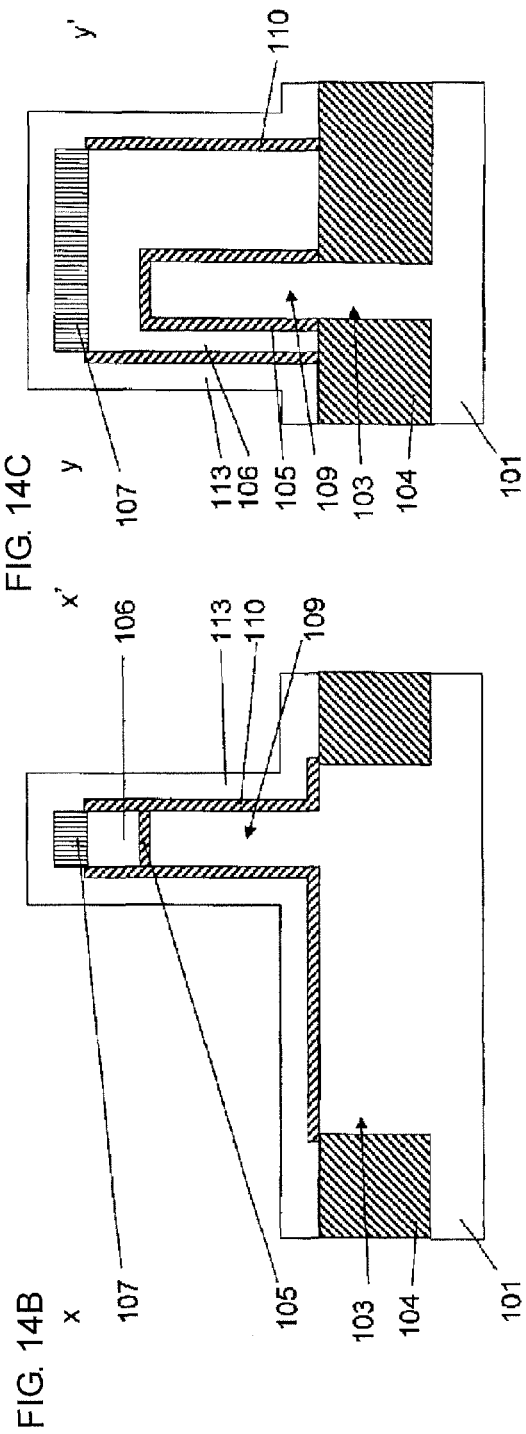
FIG. 14A
FIG. 14B
FIG. 14C

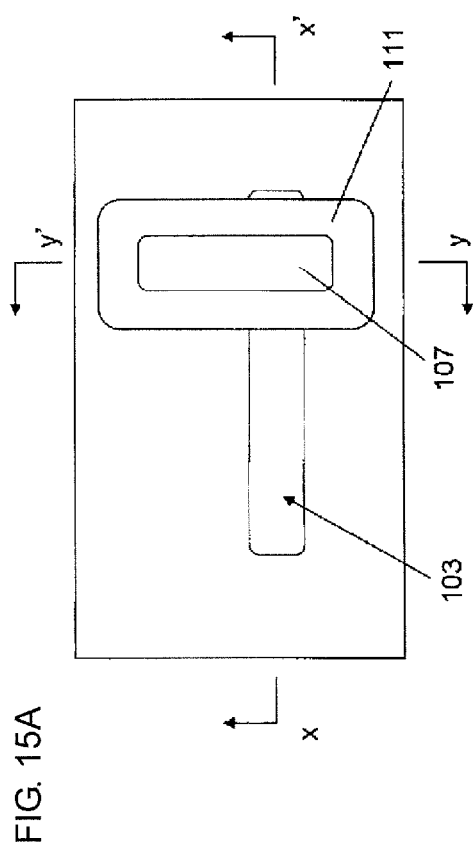
FIG. 15A
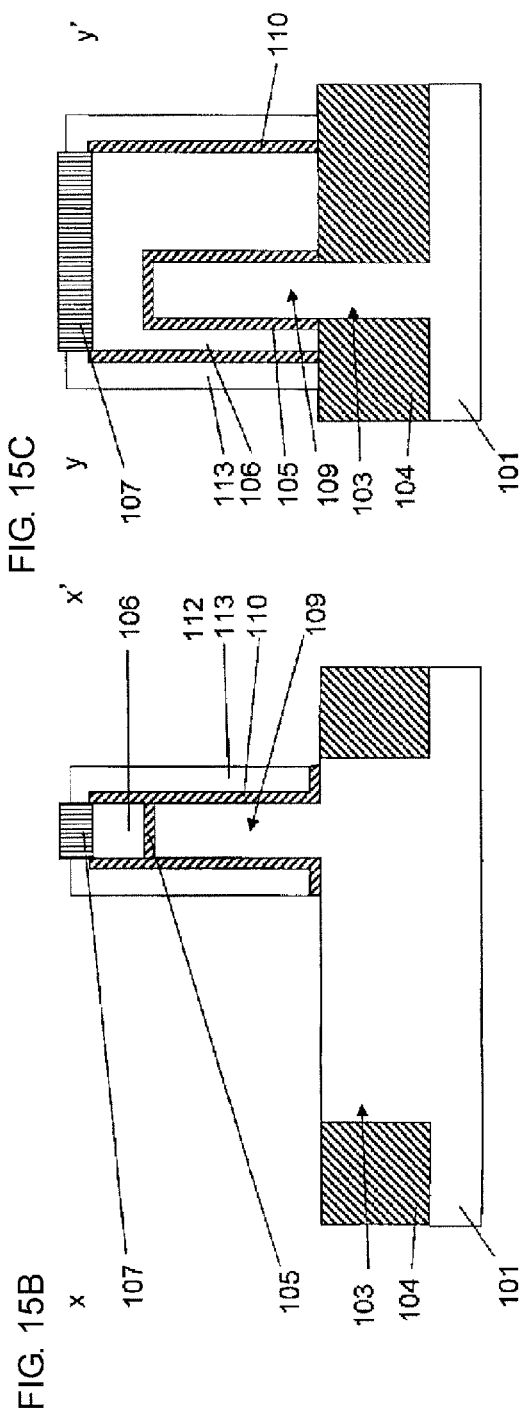
FIG. 15B
FIG. 15C

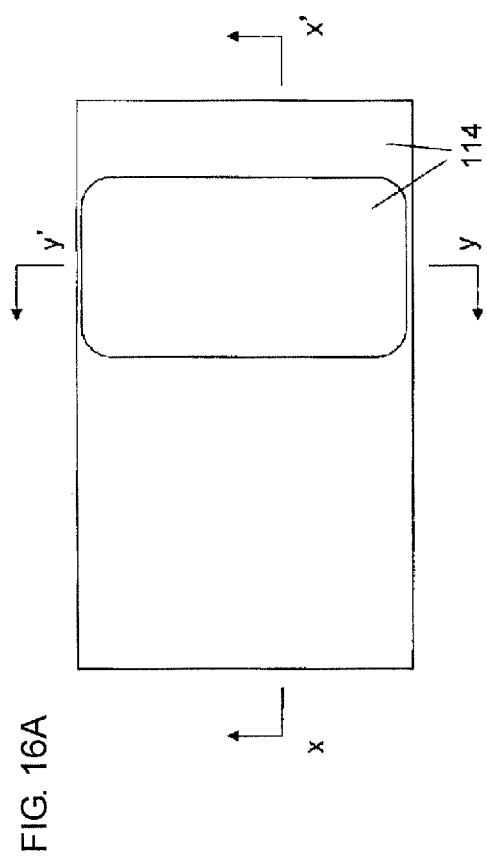
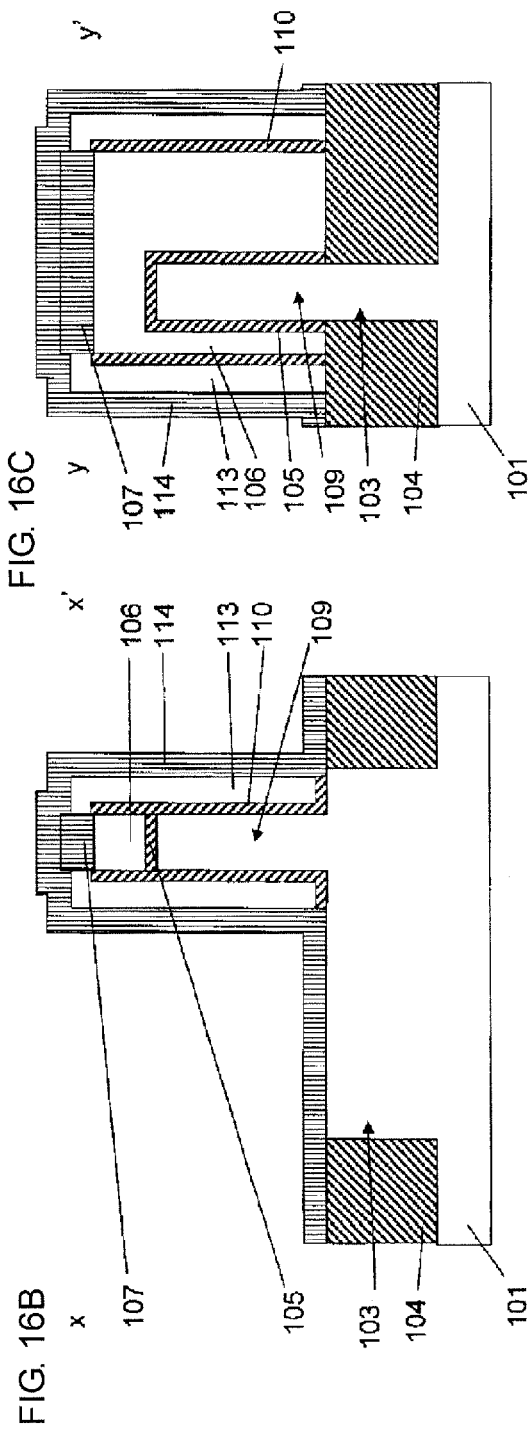
FIG. 16A
FIG. 16B
FIG. 16C

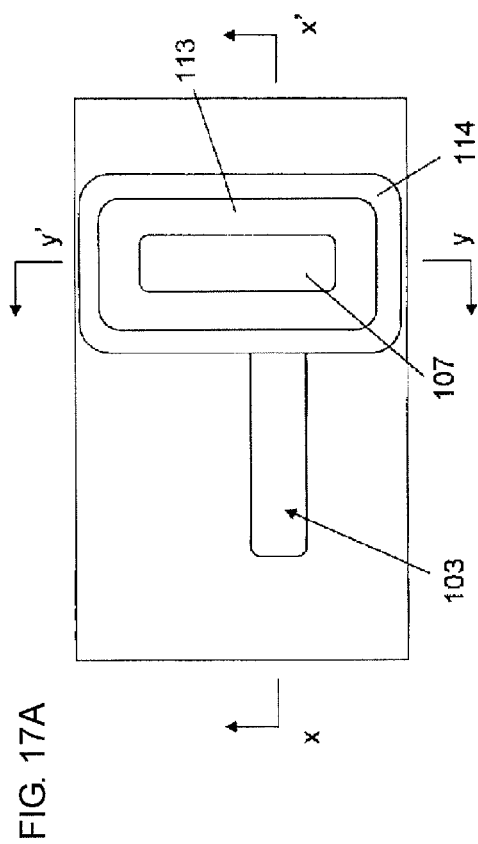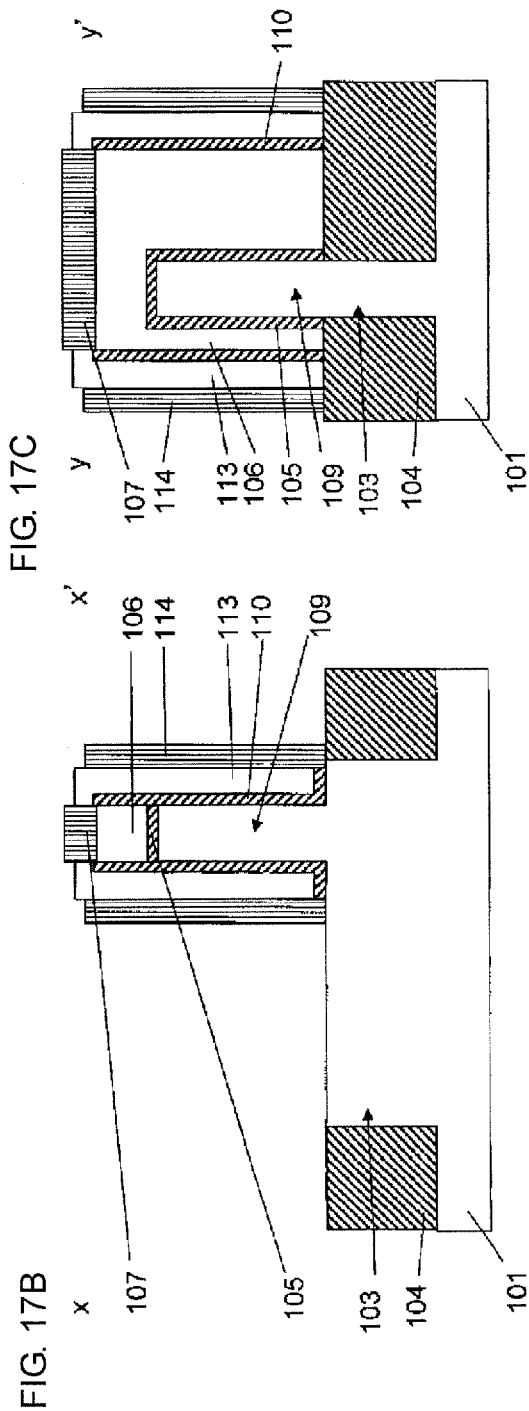
FIG. 17A
FIG. 17B
FIG. 17C

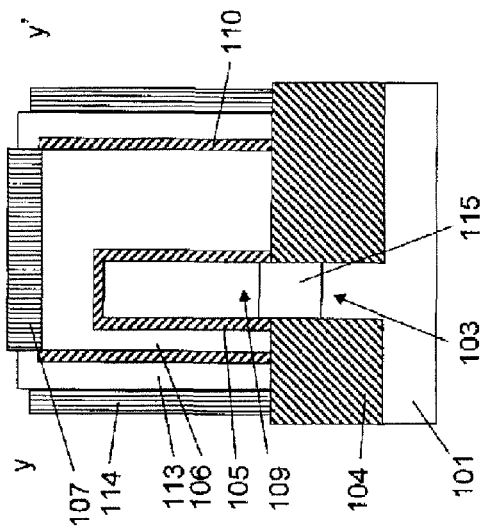
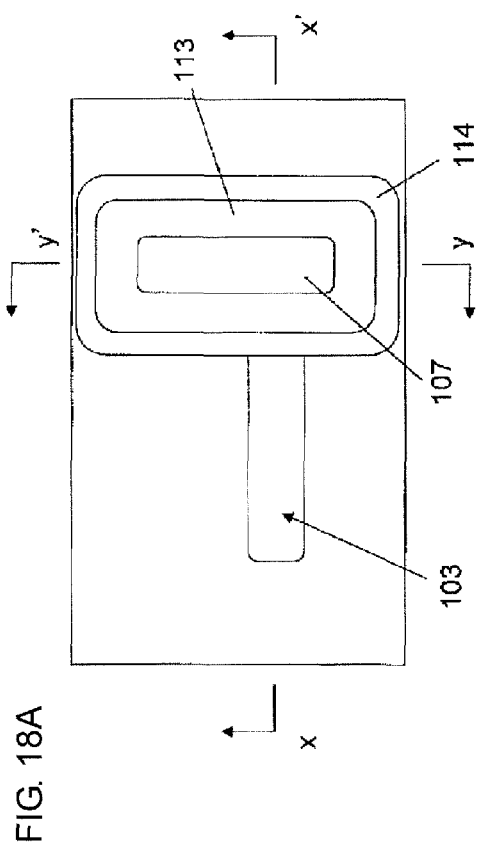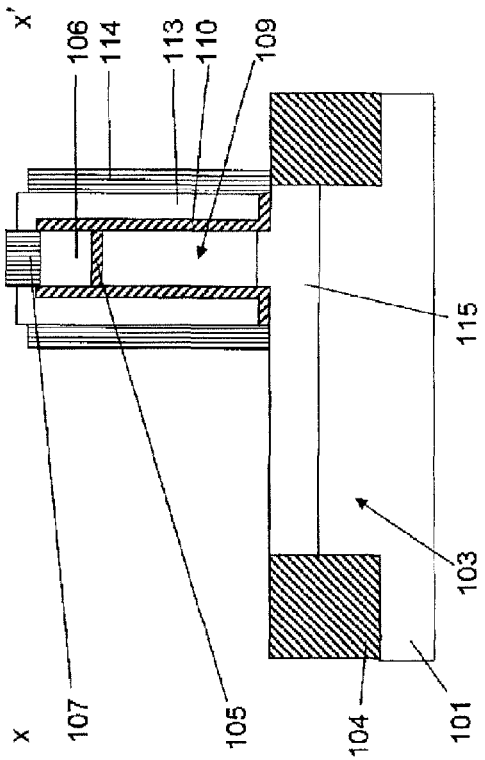

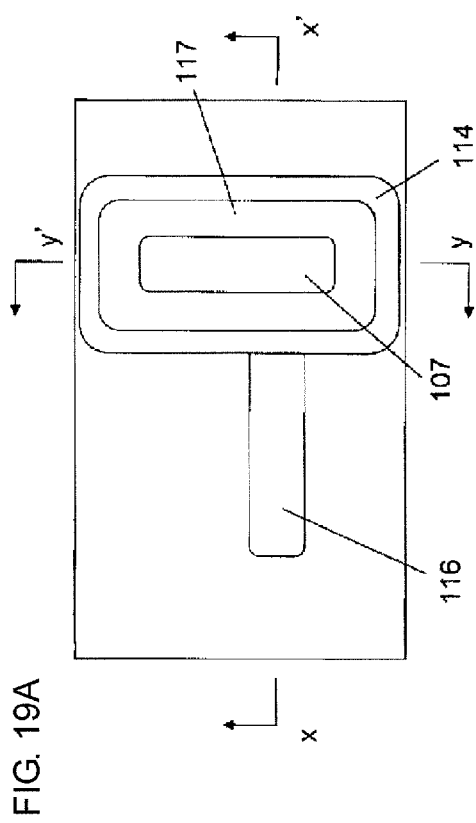
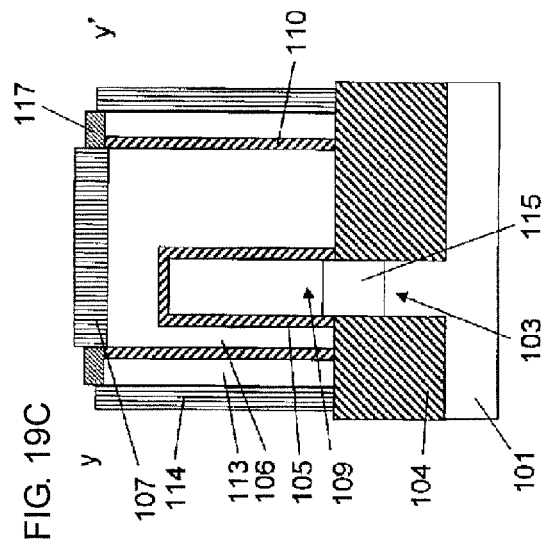
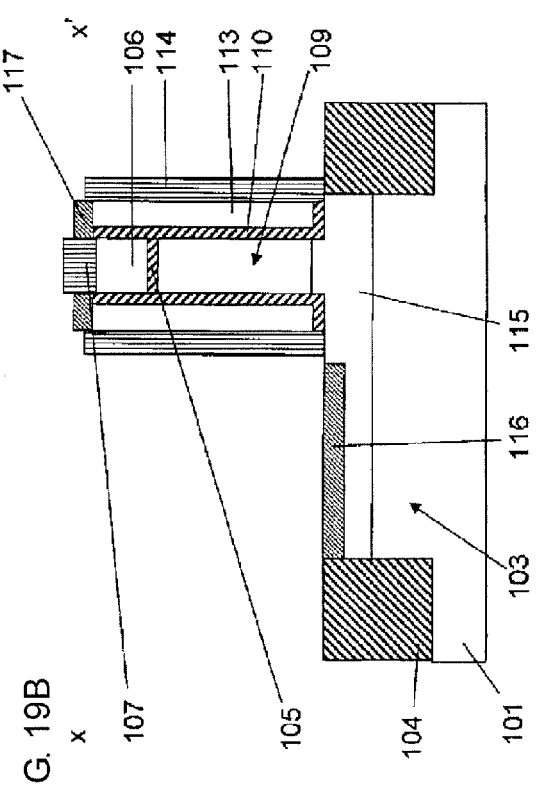

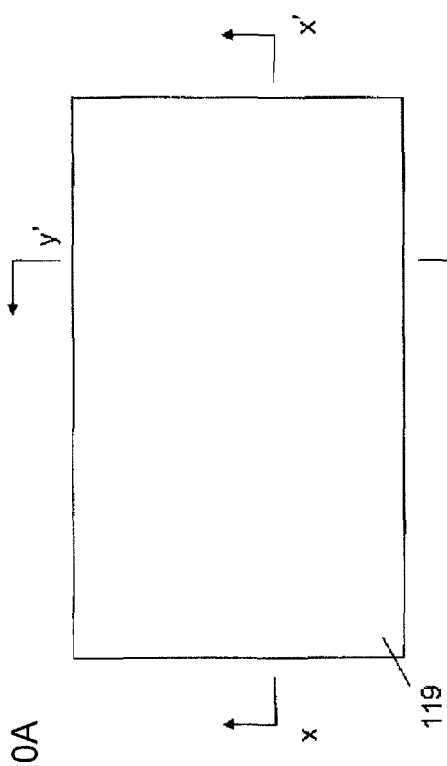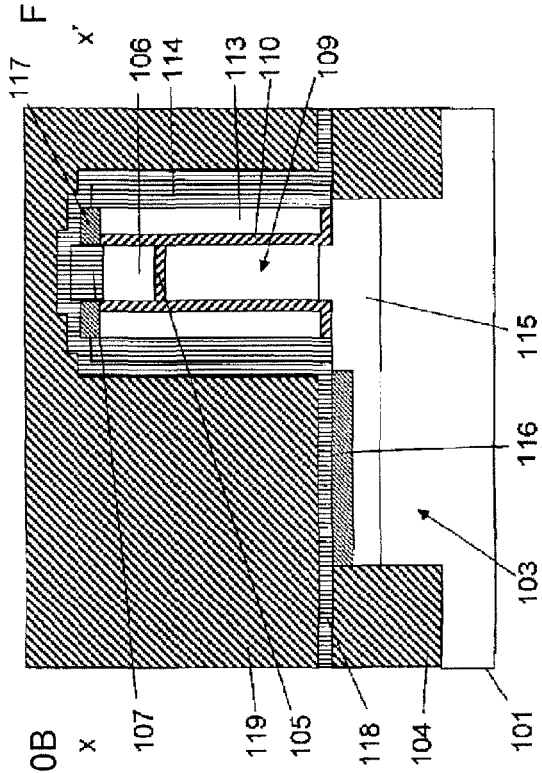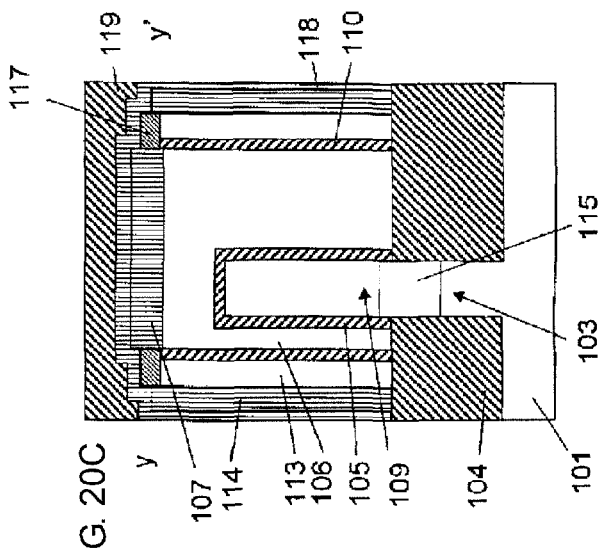

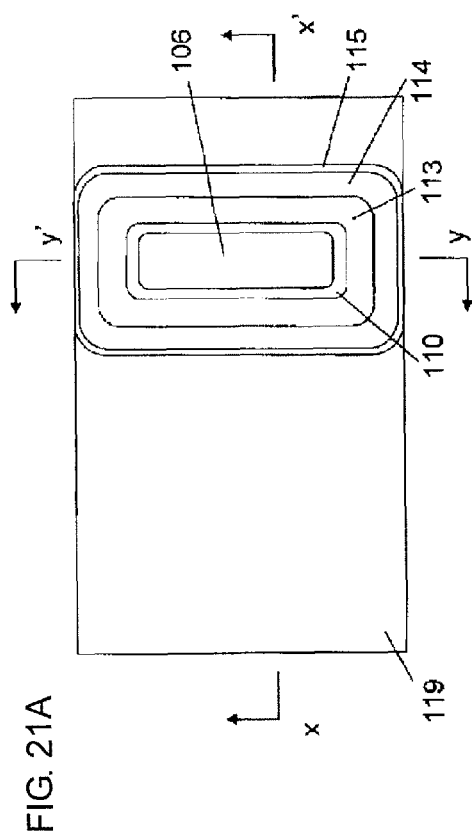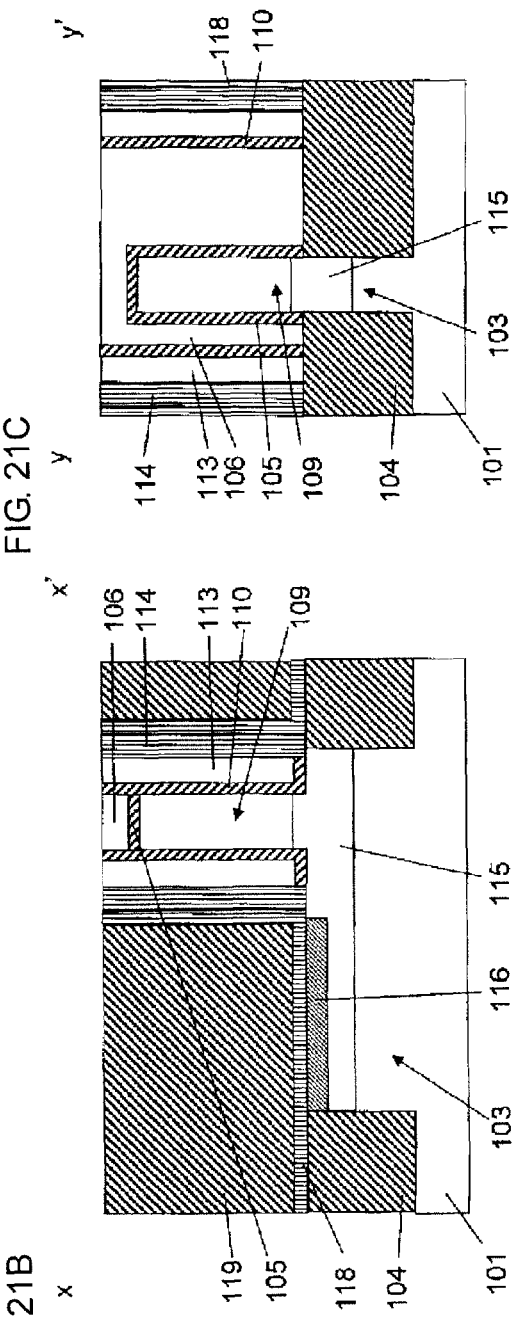

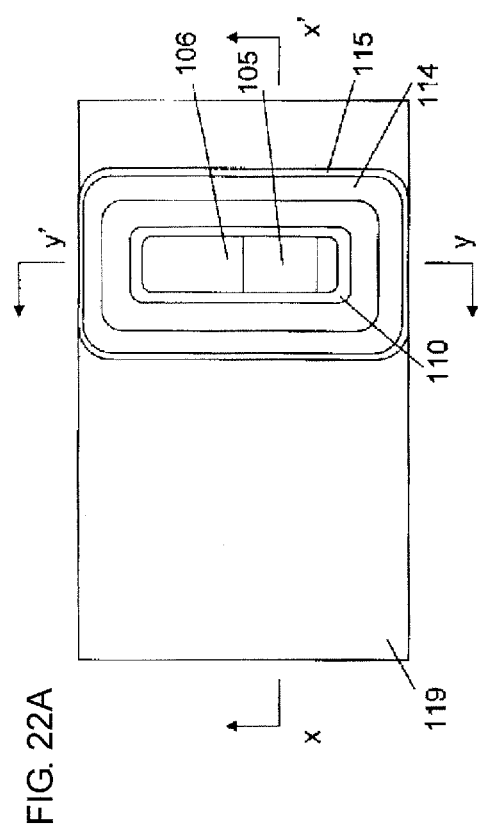
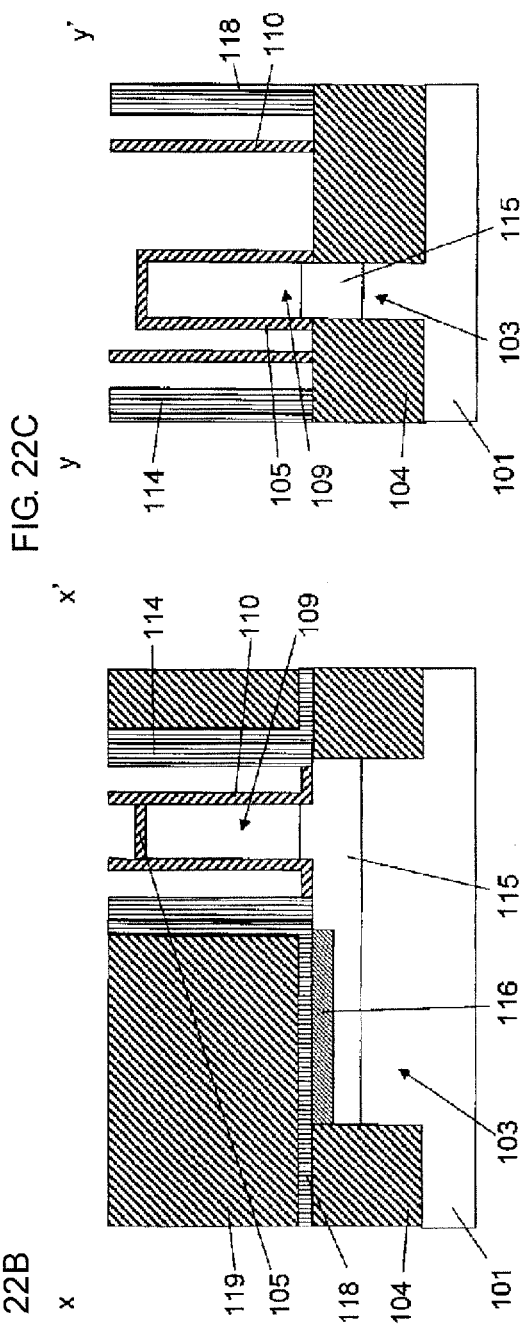
FIG. 22A
FIG. 22B
FIG. 22C

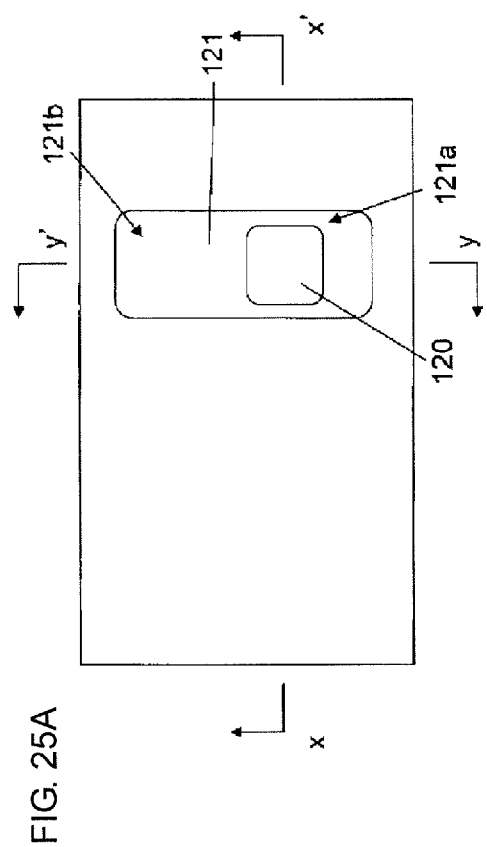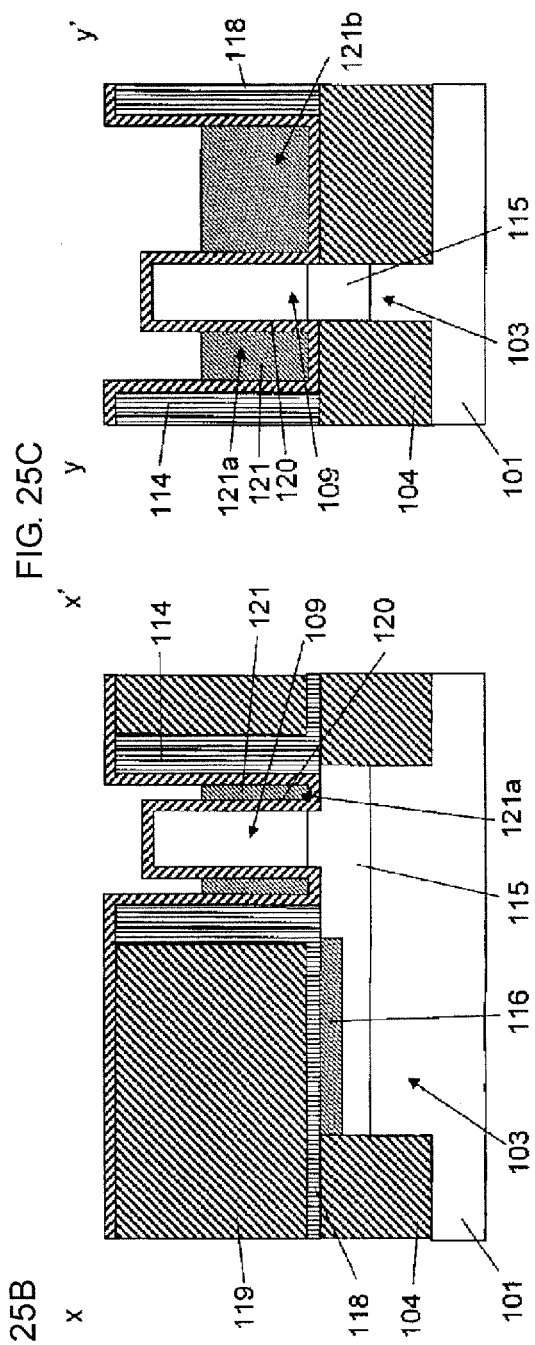
FIG. 25A
FIG. 25B
FIG. 25C

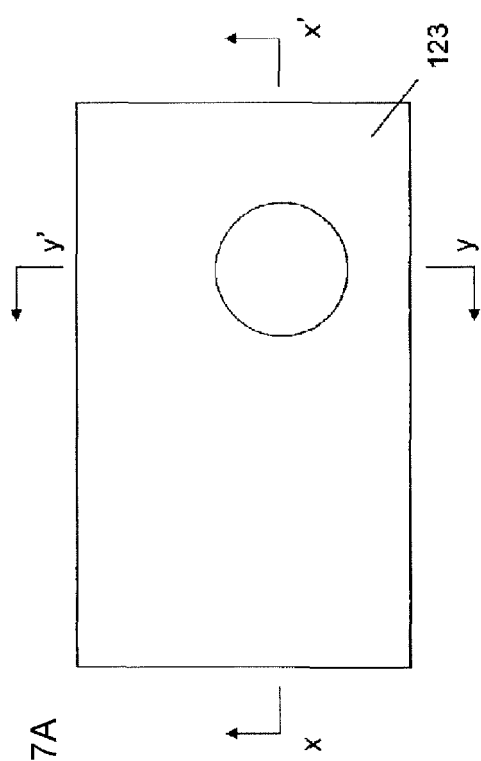
FIG. 27A
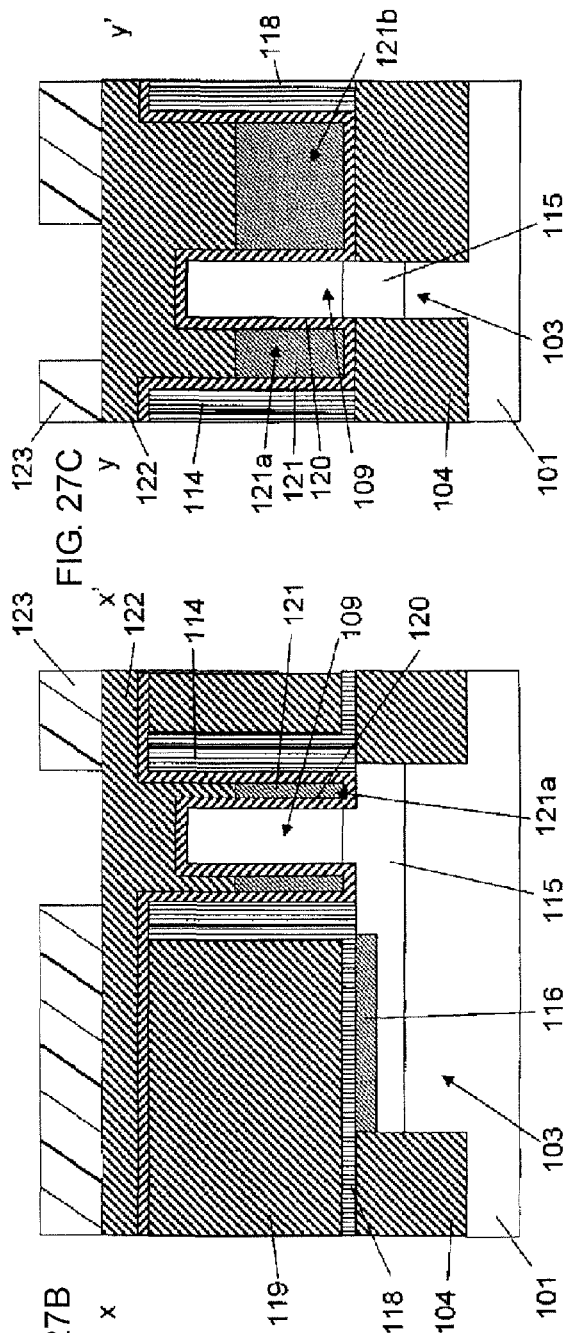
FIG. 27B
FIG. 27C

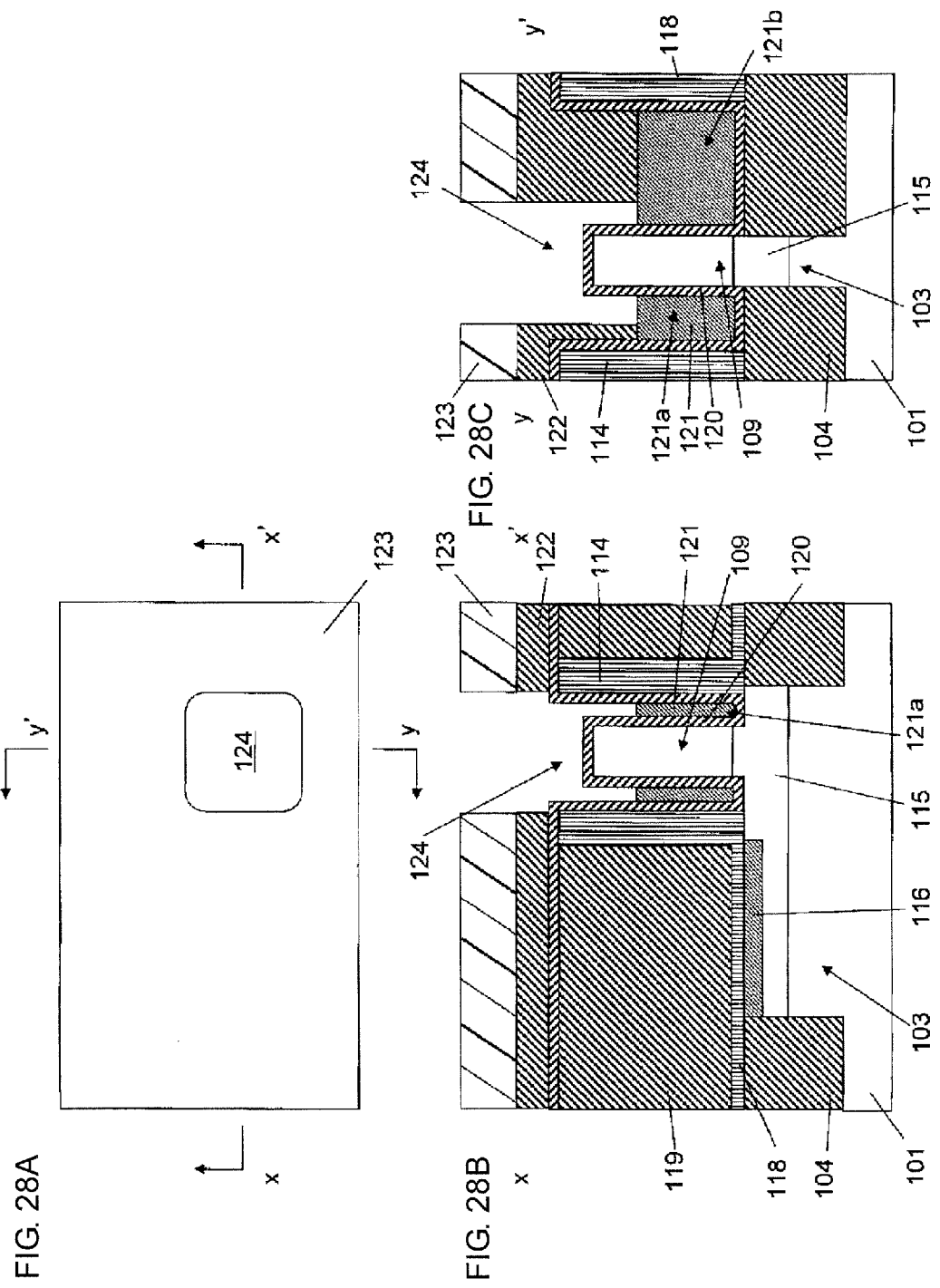

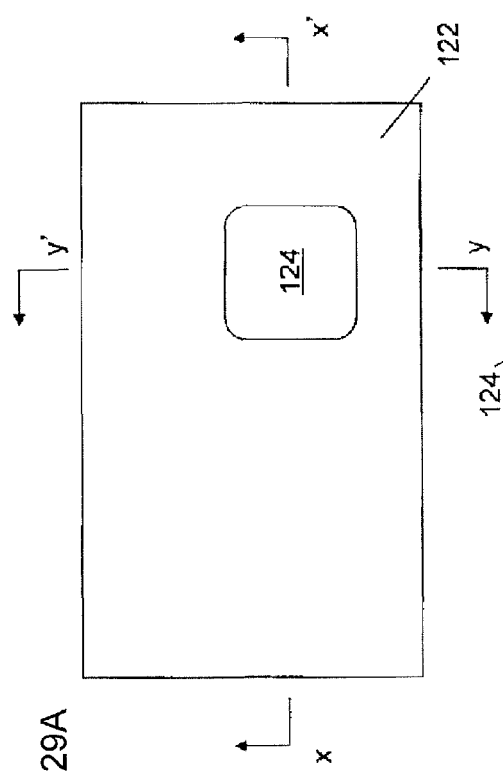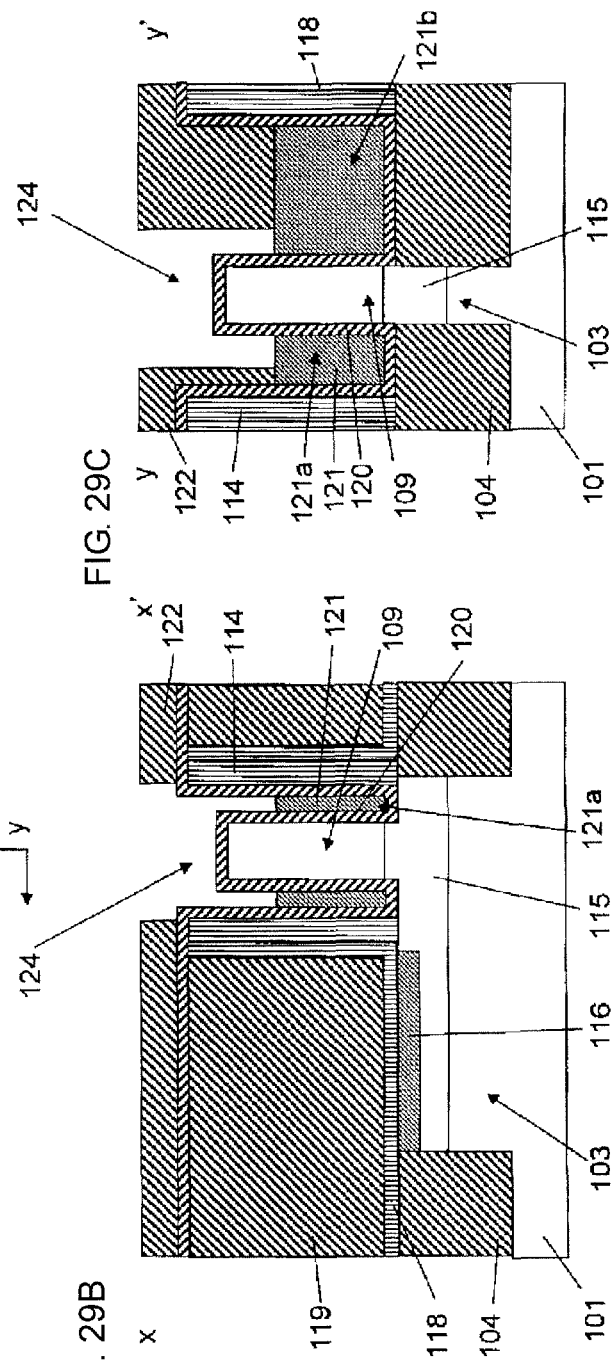
FIG. 29A
FIG. 29B
FIG. 29C

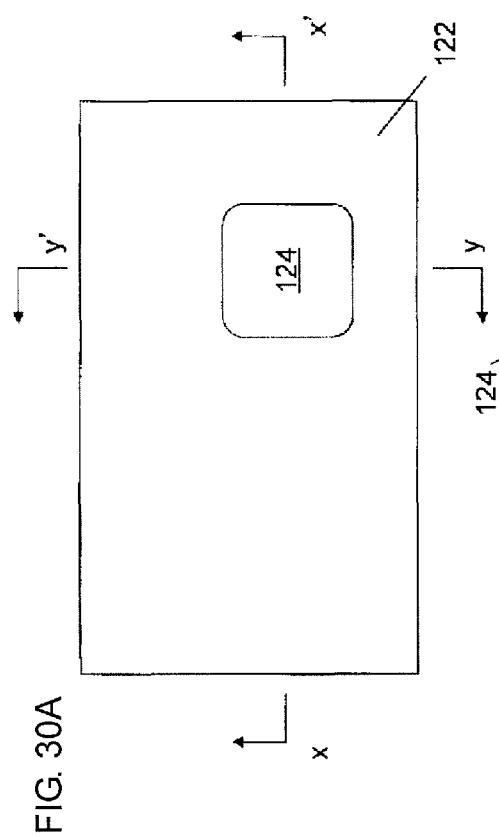
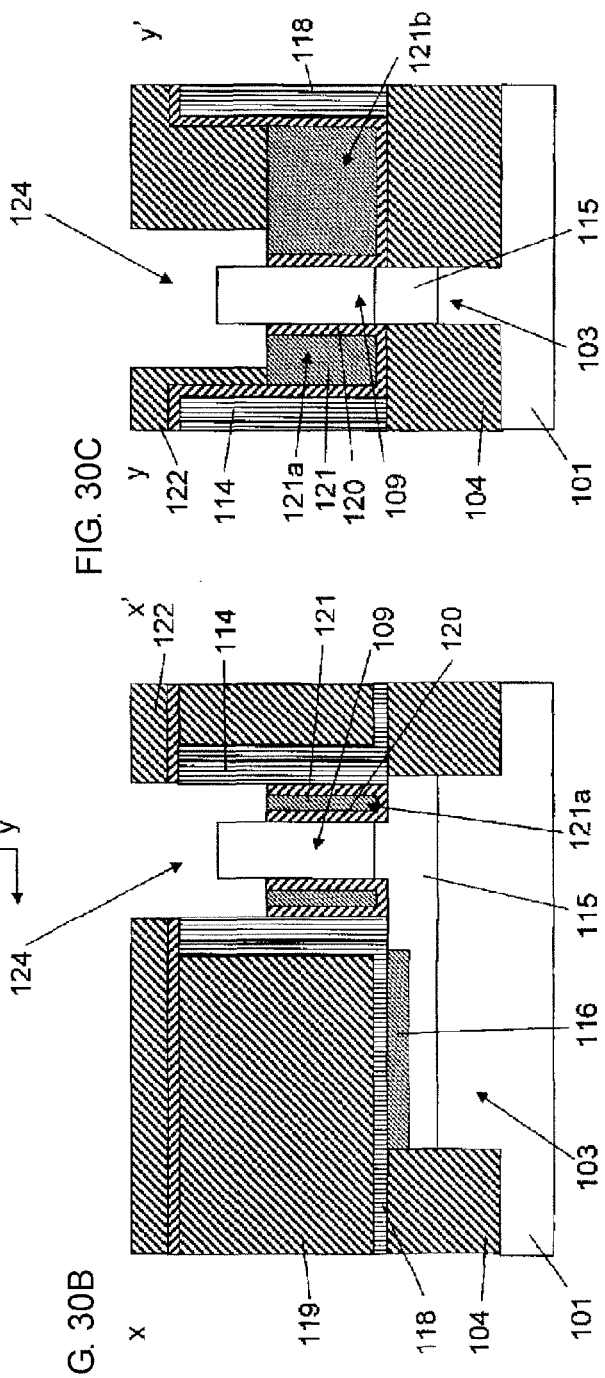
FIG. 30A
FIG. 30B
FIG. 30C

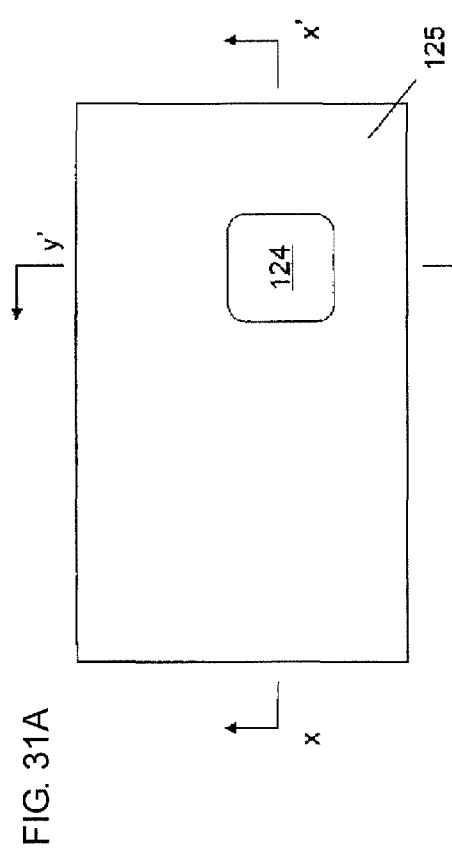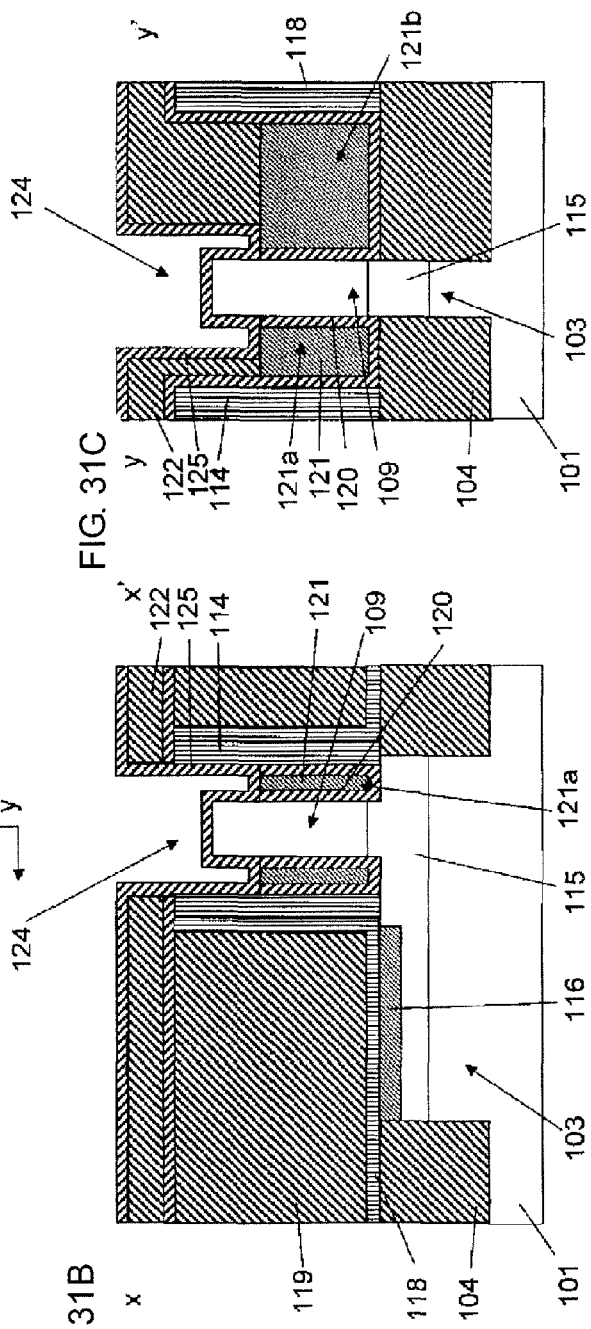
FIG. 31A
FIG. 31B
FIG. 31C

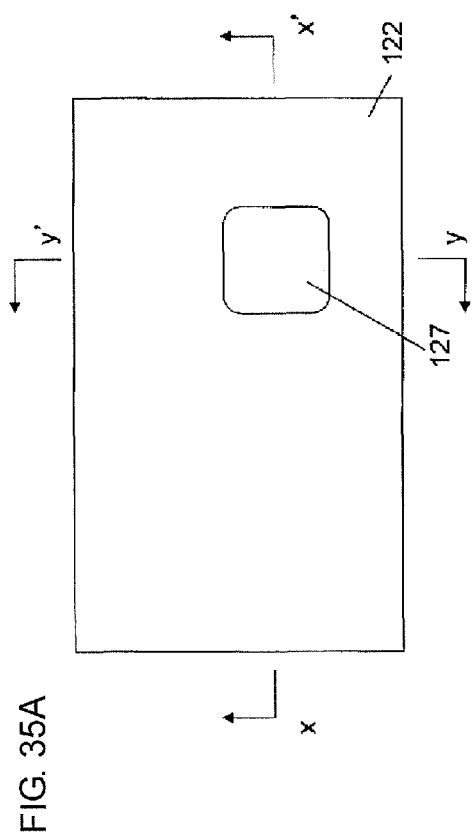
FIG. 35A
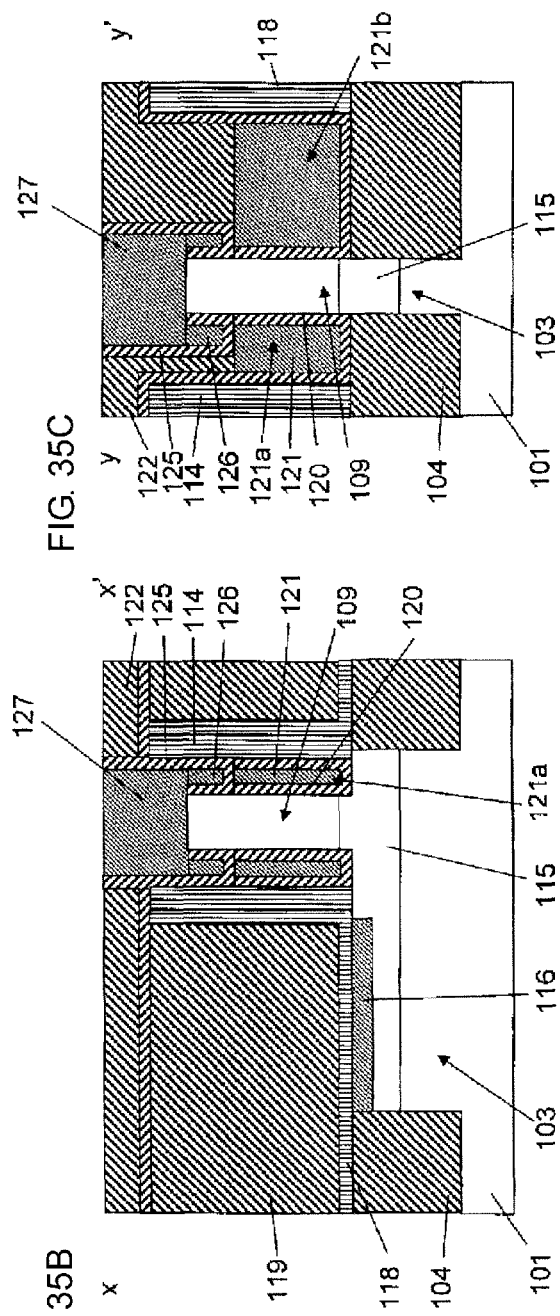
FIG. 35C
FIG. 35B

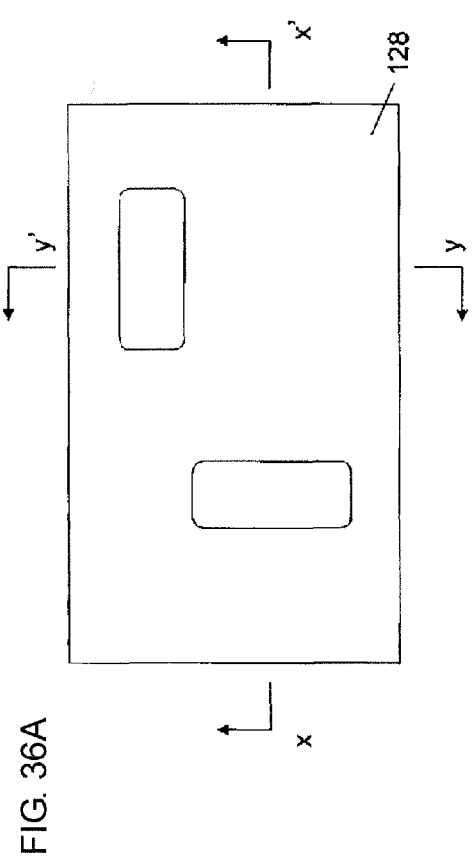
FIG. 36A
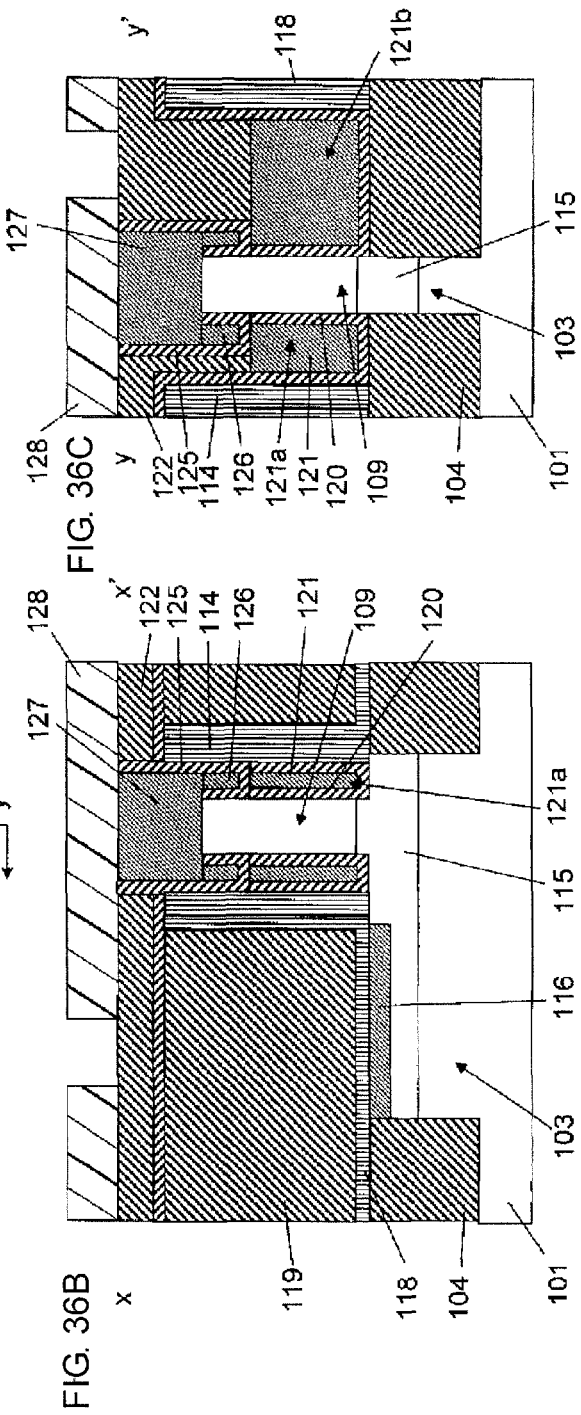
FIG. 36B
FIG. 36C

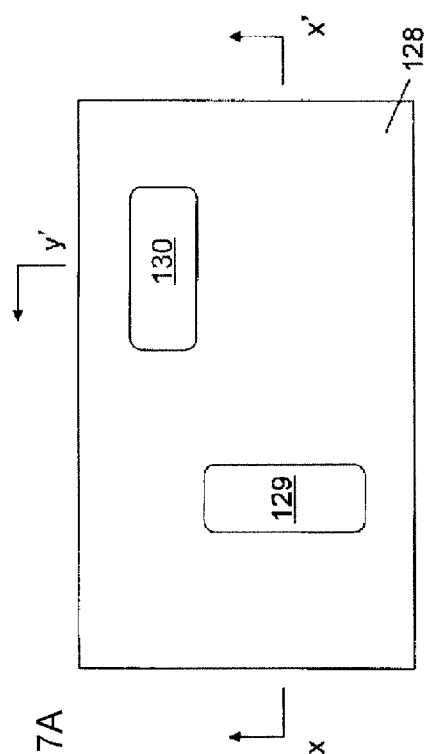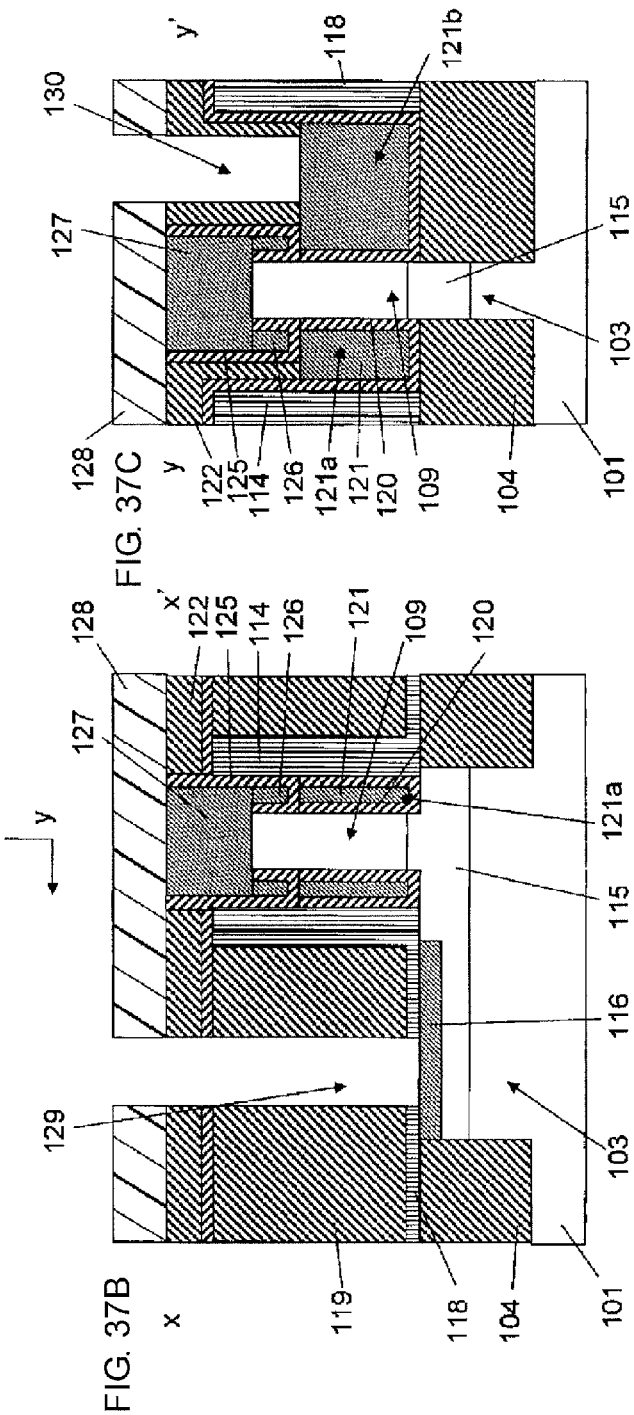
FIG. 37A
FIG. 37B
FIG. 37C

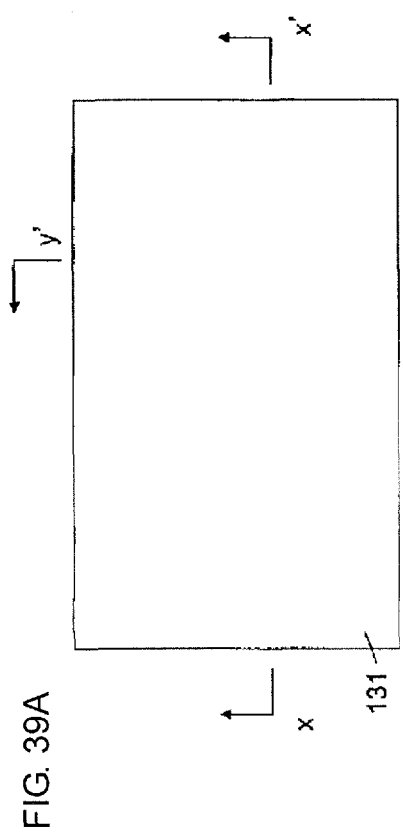
FIG. 39A
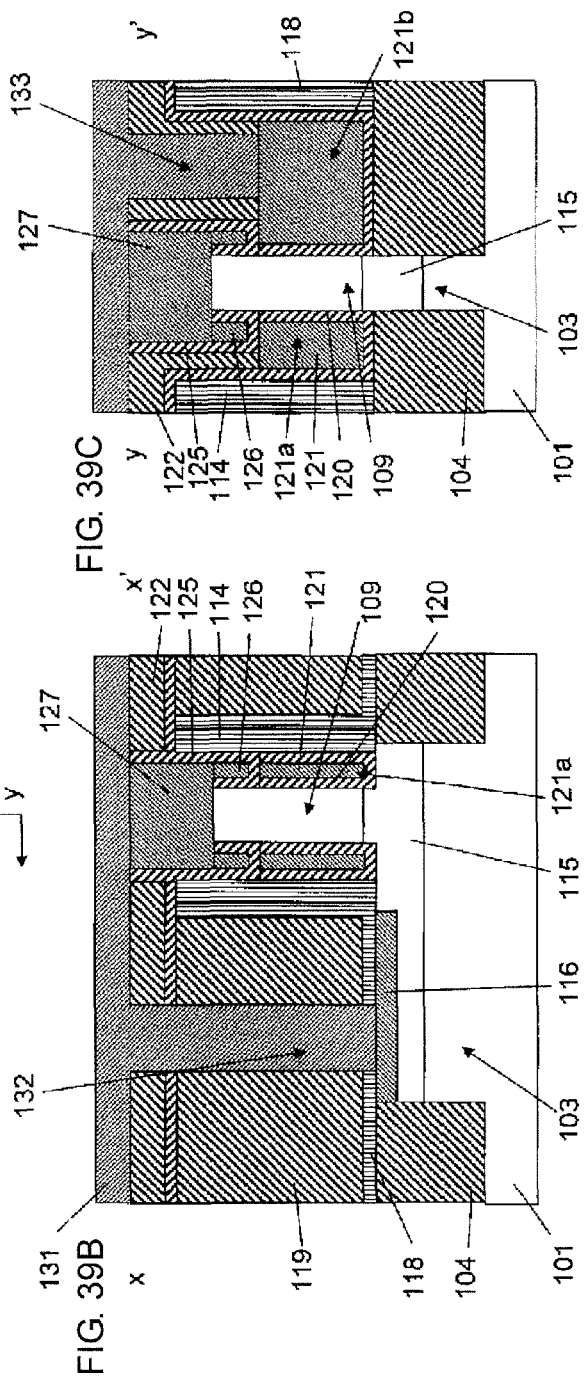
FIG. 39B
FIG. 39C

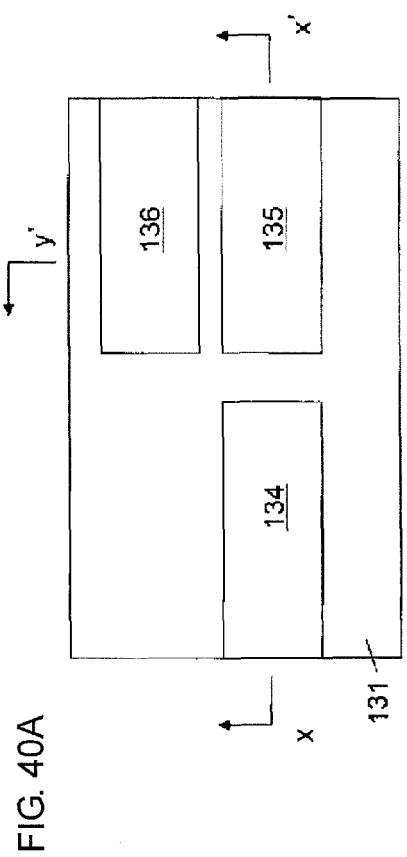
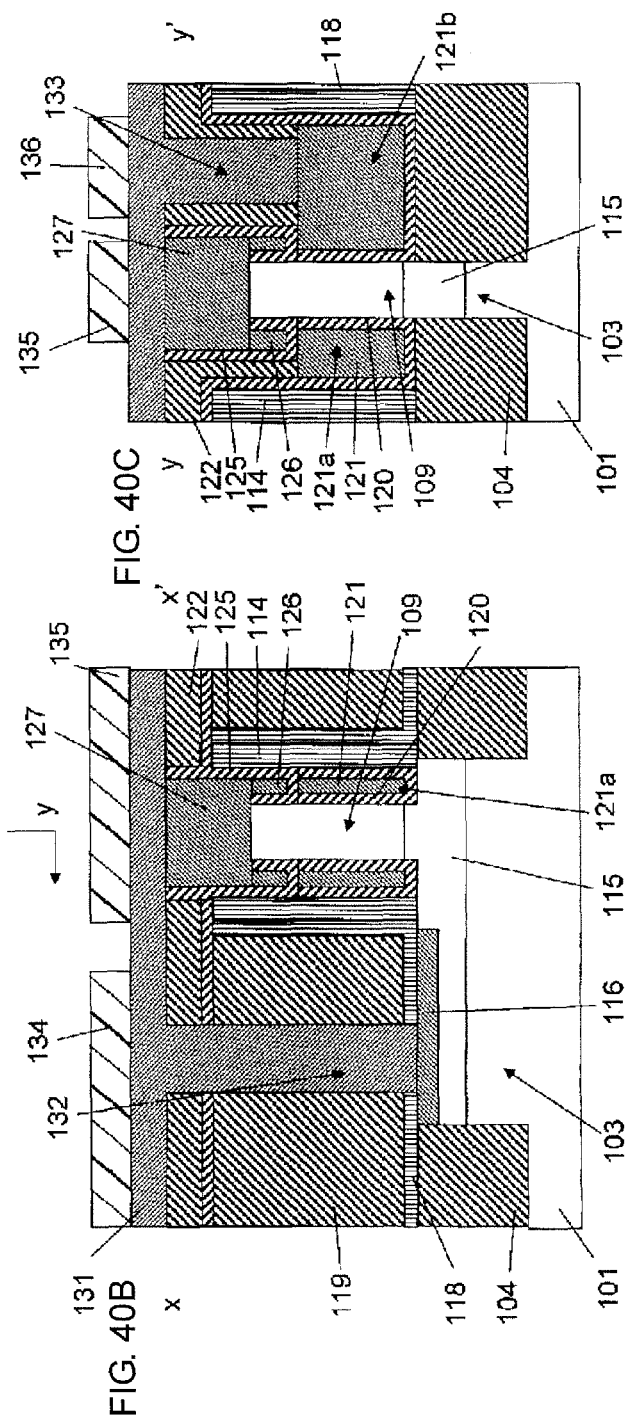
FIG. 40A
FIG. 40B
FIG. 40C

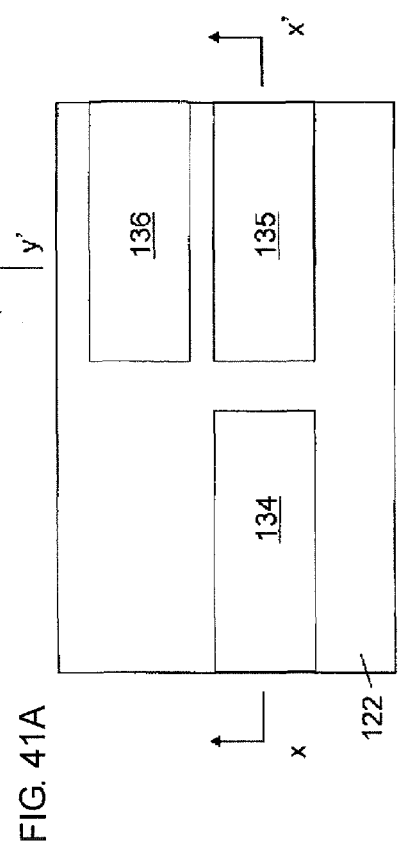
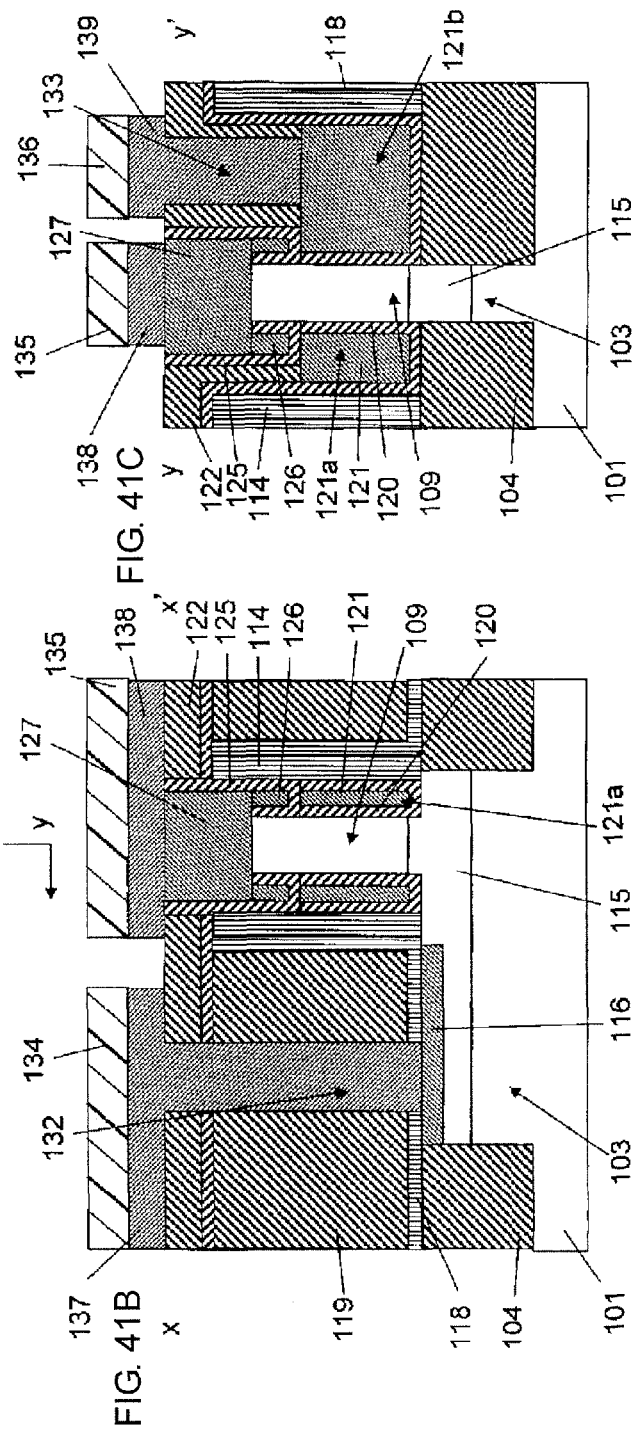
FIG. 41A
FIG. 41B
FIG. 41C

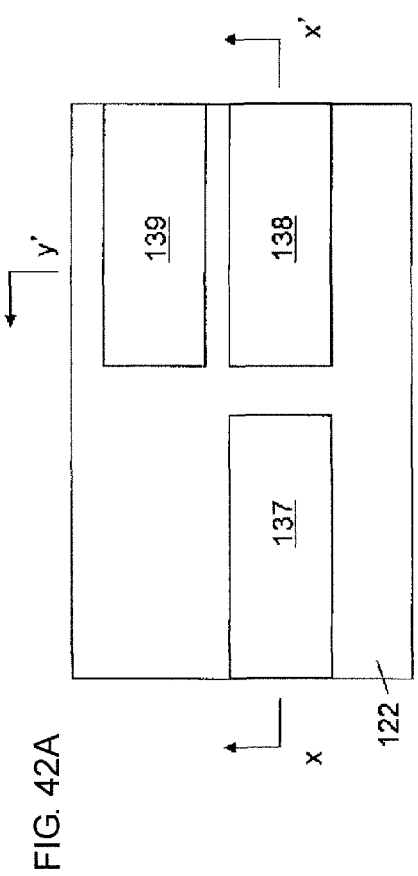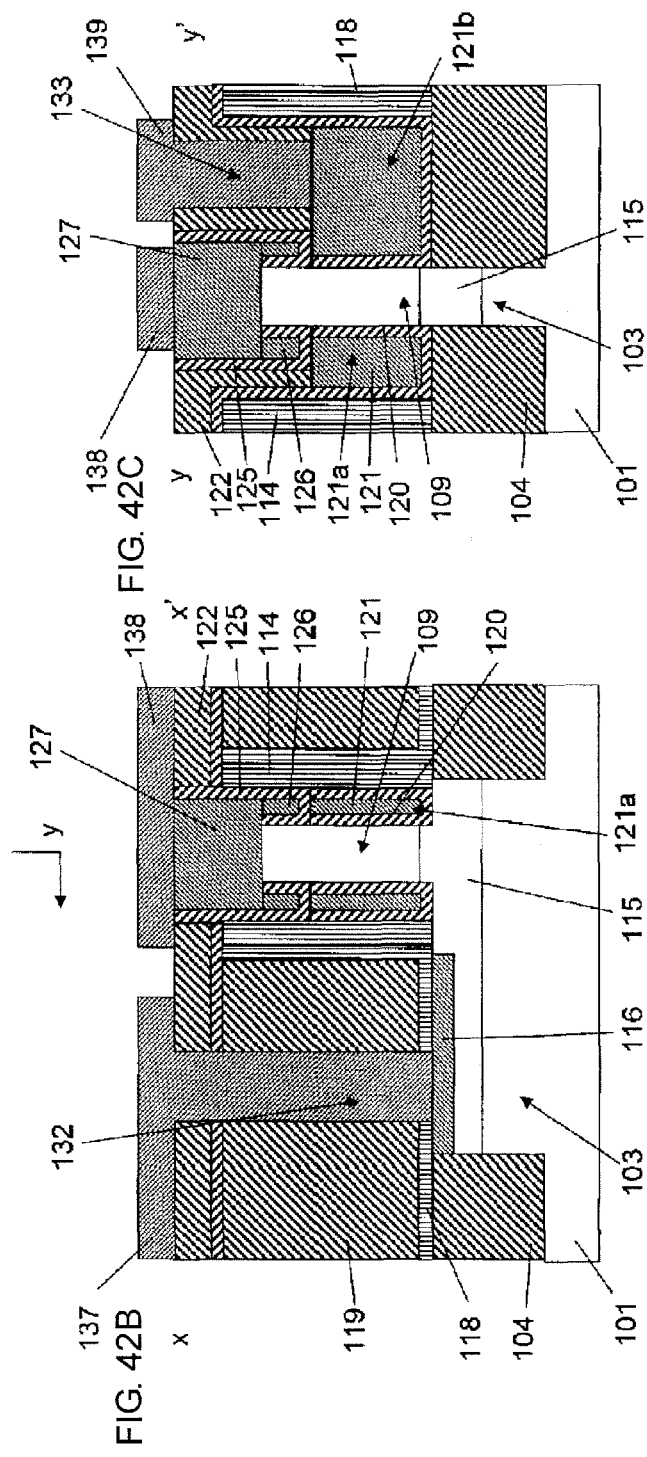
FIG. 42A
FIG. 42B
FIG. 42C

METHOD FOR PRODUCING SEMICONDUCTOR DEVICE AND SEMICONDUCTOR DEVICE

RELATED APPLICATIONS

The present application is a continuation application of PCT/JP2013/066559, filed Jun. 17, 2013, the entire contents of which are incorporated herein by reference.

BACKGROUND OF THE INVENTION

1. Field of the Invention

The present invention relates to a method for producing a semiconductor device and a semiconductor device.

2. Description of the Related Art

Semiconductor integrated circuits, in particular, integrated circuits that use MOS transistors, are continuing to achieve ever higher integration density. Due to increasing integration density, MOS transistors used therein have been miniaturized to a nanometer scale. Increasing miniaturization of MOS transistors renders it difficult to suppress leak current and a problem has arisen in which the area occupied by the circuit cannot be decreased due to the need to obtain a required amount of current. In order to address this issue, a surrounding gate transistor (hereinafter referred to as an SGT) has been proposed, in which a source, a gate, and a drain are arranged in a direction perpendicular to the substrate and a gate electrode surrounds a pillar-shaped semiconductor layer (for example, refer to Japanese Unexamined Patent Application Publication Nos. 2-71556, 2-188966, and 3-145761).

According to a typical method for producing an SGT, a silicon pillar having a pillar-shaped nitride film hard mask is formed by using a mask for forming a silicon pillar, a planar silicon layer is formed at a bottom of the silicon pillar by using a mask for forming the planar silicon layer, and a gate line is formed by using a mask for forming the gate line (for example, refer to 2009-182317). In other words, three masks are used to form a silicon pillar, a planar silicon layer, and a gate line.

A metal-gate-last process in which a metal gate is formed after a high-temperature process has been employed in actual production of typical MOS transistors in order to integrate a metal gate process and a high-temperature process (refer to IEDM 2007, K. Mistry et. al, pp 247-250). A gate is formed by using polysilicon, an interlayer insulating film is deposited, the polysilicon gate is exposed by chemical mechanical polishing and etched, and then a metal is deposited. Thus, a metal-gate-last process in which a metal gate is formed after a high-temperature process must be employed in making SGTs in order to integrate a metal gate process and a high-temperature process.

In a metal-gate-last process, a diffusion layer is formed by ion implantation after formation of a polysilicon gate. Special consideration is necessary for SGTs since the upper portion of the pillar-shaped silicon layer is covered with a polysilicon gate.

As silicon pillars become thinner, it becomes increasingly difficult to allow an impurity to exist in the silicon pillars since the density of silicon is $5 \times 10^{22}$ atoms/cm$^3$.

According to a proposal (for example, refer to Japanese Unexamined Patent Application Publication No. 2004-356314) related to typical SGTs, the threshold voltage is determined by changing the work function of the gate material while decreasing the impurity concentration in the channel to $10^{17}$ cm$^{-3}$ or less.

It has been shown that the impedance of an LDD region of a planar MOS transistor can be decreased compared to oxide film side wall LDD-type MOS transistors if the side wall of the LDD region is formed by using a polycrystalline silicon having the same conductivity type as the low-concentration layer. This is because the surface carriers of the LDD region are induced by the difference in work function (for example, refer to Japanese Unexamined Patent Application Publication No. 11-297984). This patent document shows that the polycrystalline silicon side wall is electrically insulated from the gate electrode and that an interlayer insulating film insulates the polycrystalline silicon side wall from the source and drain as illustrated in the drawings.

In a typical MOS transistor, a first insulating film is used to decrease parasitic capacitance between the gate line and the substrate. For example, in a FINFET (refer to IEDM 2010 C C. Wu, et. al, 27.1.1-27.1.4), a first insulating film is formed around one fin-shaped semiconductor layer and etched back to expose the fin-shaped semiconductor layer in order to decrease parasitic capacitance between the gate line and the substrate. Accordingly, the first insulating film is desirably used in forming an SGT in order to decrease parasitic capacitance between the gate line and the substrate. Since an SGT includes a pillar-shaped semiconductor layer in addition to a fin-shaped semiconductor layer, consideration is needed in forming the pillar-shaped semiconductor layer.

SUMMARY OF THE INVENTION

It is desirable to provide a method for producing an SGT through a gate-last process involving forming a fin-shaped semiconductor layer, a pillar-shaped semiconductor layer, a gate electrode, and a gate line by using two masks, in which an upper portion of the pillar-shaped semiconductor layer functions as an n-type semiconductor layer or a p-type semiconductor layer due to the difference in work function between the metal and the semiconductor. It is also desirable to provide an SGT structure obtained by this method.

A first aspect of the invention provides a method for producing a semiconductor device. The method includes a first step of forming a fin-shaped semiconductor layer on a semiconductor substrate and forming a first insulating film around the fin-shaped semiconductor layer; a second step following the first step, the second step including forming a pillar-shaped semiconductor layer and a first dummy gate formed of a first polysilicon; a third step following the second step, the third step including forming a second dummy gate on side walls of the first dummy gate and the pillar-shaped semiconductor layer; a fourth step following the third step, the fourth step including forming a side wall formed of a fifth insulating film around the second dummy gate, forming a second diffusion layer in an upper portion of the fin-shaped semiconductor layer and a lower portion of the pillar-shaped semiconductor layer, and forming a metal-semiconductor compound on the second diffusion layer; a fifth step following the fourth step, the fifth step including forming a gate electrode and a gate line; and a sixth step following the fifth step, the sixth step including depositing a sixth insulating film, forming a third resist for forming a contact hole on the pillar-shaped semiconductor layer, etching the sixth insulating film to form a contact hole on the pillar-shaped semiconductor layer, removing the third resist, depositing a second gate insulating film, depositing a second metal, etching back the second metal, removing the second gate insulating film on the pillar-shaped semiconductor layer so as to form a metal side wall on a side wall of an upper portion of the pillar-shaped semiconductor layer, and depositing a third metal so as to form a contact that connects an upper portion of the metal side wall to an upper portion of the pillar-shaped semiconductor layer.

The second step may include forming a second insulating film around the fin-shaped semiconductor layer, depositing the first polysilicon on the second insulating film to conduct planarization, forming a second resist for forming the gate line and the pillar-shaped semiconductor layer so that the second resist extends in a direction perpendicular to a direction in which the fin-shaped semiconductor layer extends, and etching the first polysilicon, the second insulating film, and the fin-shaped semiconductor layer so as to form the pillar-shaped semiconductor layer and the first dummy gate formed of the first polysilicon.

The third step may include forming a fourth insulating film around the pillar-shaped semiconductor layer and the first dummy gate, depositing a second polysilicon around the fourth insulating film, and etching the second polysilicon so that the second polysilicon remains on side walls of the first dummy gate and the pillar-shaped semiconductor layer and forms the second dummy gate.

The fourth step may include forming the fifth insulating film around the second dummy gate, etching the fifth insulating film into a side wall shape so as to form the side wall formed of the fifth insulating film, forming the second diffusion layer in the upper portion of the fin-shaped semiconductor layer and the lower portion of the pillar-shaped semiconductor layer, and forming the metal-semiconductor compound on the second diffusion layer.

The fifth step may include depositing an interlayer insulating film, conducting chemical mechanical polishing to expose an upper portion of the second dummy gate and an upper portion of the first dummy gate, removing the second dummy gate and the first dummy gate, removing the second insulating film and the fourth insulating film, forming a first gate insulating film around the pillar-shaped semiconductor layer and on inner sides of the fifth insulating film, depositing a first metal, and etching back the first metal so as to form the gate electrode and the gate line.

The second step may further include forming a third insulating film on the first polysilicon after depositing the first polysilicon on the second insulating film and conducting planarization.

The method may further include depositing a contact stopper film after the fourth step.

The method may further include removing the first gate insulating film after the fifth step.

A metal that forms the metal side wall may have a work function in the range of 4.0 eV to 4.2 eV.

A metal that forms the metal side wall may have a work function in the range of 5.0 eV to 5.2 eV.

A second aspect of the present invention provides a semiconductor device that includes a fin-shaped semiconductor layer disposed on a semiconductor substrate; a first insulating film disposed around the fin-shaped semiconductor layer, a pillar-shaped semiconductor layer disposed on the fin-shaped semiconductor layer; a first gate insulating film disposed around the pillar-shaped semiconductor layer; a gate electrode formed of a metal disposed around the first gate insulating film; a gate line connected to the gate electrode and formed of a metal that extends in a direction perpendicular to a direction in which the fin-shaped semiconductor layer extends; a second diffusion layer disposed in an upper portion of the fin-shaped semiconductor layer and a lower portion of the pillar-shaped semiconductor layer; a second gate insulating film disposed around a side wall of an upper portion of the pillar-shaped semiconductor layer; a metal side wall disposed around the second gate insulating film; and a contact that connects an upper portion of the metal side wall to an upper portion of the pillar-shaped semiconductor layer. In this device, a width of the pillar-shaped semiconductor layer in a direction perpendicular to a direction in which the fin-shaped semiconductor layer extends is equal to a width of the fin-shaped semiconductor layer in the direction perpendicular to the direction in which the fin-shaped semiconductor layer extends. The first gate insulating film is disposed around and at bottoms of the gate electrode and the gate line, and an outer width of the gate electrode is equal to a width of the gate line.

The semiconductor device may further include a second gate insulating film disposed around and at a bottom of the metal side wall.

A metal that forms the metal side wall may have a work function in the range of 4.0 eV to 4.2 eV.

A metal that forms the metal side wall may have a work function in the range of 5.0 eV to 5.2 eV.

The present invention can provide a method for producing an SGT structure through a gate-last process, with which a fin-shaped semiconductor layer, a pillar-shaped semiconductor layer, a gate electrode, and a gate line can be formed by using two masks and an upper portion of the pillar-shaped semiconductor layer can function as an n-type semiconductor layer or a p-type semiconductor layer depending on the difference in work function between the metal and semiconductor. An SGT structure obtained through the method is also provided.

A fin-shaped semiconductor layer, a pillar-shaped semiconductor layer, and first and second dummy gates which will later form a gate electrode and a gate line can be formed by using two masks through the following steps: the first step of forming a fin-shaped semiconductor layer on a semiconductor substrate and forming a first insulating film around the fin-shaped semiconductor layer; the second step following the first step and including forming a second insulating film around the fin-shaped semiconductor layer, depositing the first polysilicon on the second insulating film to conduct planarization, forming a second resist for forming the gate line and the pillar-shaped semiconductor layer so that the second resist extends in a direction perpendicular to a direction in which the fin-shaped semiconductor layer extends, and etching the first polysilicon, the second insulating film, and the fin-shaped semiconductor layer so as to form the pillar-shaped semiconductor layer and the first dummy gate formed of the first polysilicon; the third step following the second step and including forming a fourth insulating film around the pillar-shaped semiconductor layer and the first dummy gate, depositing a second polysilicon around the fourth insulating film, and etching the second polysilicon so that the second polysilicon remains on side walls of the first dummy gate and the pillar-shaped semiconductor layer and forms the second dummy gate; the fourth step following the third step and including forming the fifth insulating film around the second dummy gate, etching the fifth insulating film into a side wall shape so as to form a side wall formed of the fifth insulating film, forming the second diffusion layer in the upper portion of the fin-shaped semiconductor layer and the lower portion of the pillar-shaped semiconductor layer, and forming the metal-semiconductor compound on the second diffusion layer; and the fifth step following the fourth step and including depositing an interlayer insulating film, conducting chemical mechanical polishing to expose an upper portion of the second dummy gate and an upper portion of the first dummy gate, removing the second dummy gate and the first dummy gate, removing the second insulating film and the fourth insulating film, forming a first gate insulating film around the pillar-shaped semiconductor layer and on inner sides of the fifth insulating film, depositing a first metal, and etching back the first metal so as to form the gate electrode and the gate line. Thus, the number of steps can be decreased.

Misalignment between the pillar-shaped semiconductor layer and the gate line can be eliminated.

Moreover, a metal gate SGT can be easily formed since a typical metal-gate-last production process can be used which involves forming a first dummy gate and a second dummy gate by using polysilicon, depositing an interlayer insulating film, exposing the first dummy gate and the second dummy gate by chemical mechanical etching, etching the polysilicon gate, and then depositing a metal.

There is no need to form a diffusion layer in an upper portion of the pillar-shaped semiconductor layer due to the sixth step that follows the fifth step and includes depositing a sixth insulating film, forming a third resist for forming a contact hole on the pillar-shaped semiconductor layer, etching the sixth insulating film to form a contact hole on the pillar-shaped semiconductor layer, removing the third resist, depositing a second gate insulating film, depositing a second metal, etching back the second metal, removing the second gate insulating film on the pillar-shaped semiconductor layer so as to form a metal side wall on a side wall of an upper portion of the pillar-shaped semiconductor layer, and depositing a third metal so as to form a contact that connects an upper portion of the metal side wall to an upper portion of the pillar-shaped semiconductor layer.

Using a metal-gate-last process to produce an SGT is difficult since the upper portion of the pillar-shaped semiconductor layer is covered with a polysilicon gate and it is difficult to form a diffusion layer in the upper portion of the pillar-shaped semiconductor layer. This forces formation of a diffusion layer in an upper portion of a pillar-shaped semiconductor layer to be performed before formation of a polysilicon gate. However, according to the present invention, no diffusion layer is formed in an upper portion of a pillar-shaped semiconductor layer and the upper portion of the pillar-shaped semiconductor layer can function as an n-type semiconductor layer or a p-type semiconductor layer depending on the difference in work function between the metal and semiconductor. Accordingly, the step of forming a diffusion layer in an upper portion of a pillar-shaped semiconductor layer can be omitted.

Moreover, the first gate insulating film disposed around and at bottoms of the gate electrode and the gate line insulates the gate electrode and the gate line from the pillar-shaped semiconductor layer and the fin-shaped semiconductor layer.

The second gate insulating film disposed around and at a bottom of the metal side wall can insulate the gate electrode and the gate line from the metal side wall even when the gate electrode and the gate line have come to be exposed after formation of contact holes by etching since the second gate insulating film is formed after etching.

BRIEF DESCRIPTION OF THE DRAWINGS

FIG. 2A is a plan view related to a method for producing a semiconductor device according to an embodiment, FIG. 2B is a cross-sectional view taken along line x-x' in FIG. 2A, and FIG. 2C is a cross-sectional view taken along line y-y' in FIG. 2A.

FIG. 3A is a plan view related to the method for producing a semiconductor device according to an embodiment, FIG. 3B is a cross-sectional view taken along line x-x' in FIG. 3A, and FIG. 3C is a cross-sectional view taken along line y-y' in FIG. 3A.

FIG. 5A is a plan view related to the method for producing a semiconductor device according to an embodiment, FIG. 5B is a cross-sectional view taken along line x-x' in FIG. 5A, and FIG. 5C is a cross-sectional view taken along line y-y' in FIG. 5A.

FIG. 10A is a plan view related to the method for producing a semiconductor device according to an embodiment, FIG. 10B is a cross-sectional view taken along line x-x' in FIG. 10A, and FIG. 10C is a cross-sectional view taken along line y-y' in FIG. 10A.

FIG. 11A is a plan view related to the method for producing a semiconductor device according to an embodiment, FIG. 11B is a cross-sectional view taken along line x-x' in FIG. 11A, and FIG. 11C is a cross-sectional view taken along line y-y' in FIG. 11A.

FIG. 12A is a plan view related to the method for producing a semiconductor device according to an embodiment, FIG. 12B is a cross-sectional view taken along line x-x' in FIG. 12A, and FIG. 12C is a cross-sectional view taken along line y-y' in FIG. 12A.

FIG. 13A is a plan view related to the method for producing a semiconductor device according to an embodiment, FIG. 13B is a cross-sectional view taken along line x-x' in FIG. 13A, and FIG. 13C is a cross-sectional view taken along line y-y' in FIG. 13A.

FIG. 14A is a plan view related to the method for producing a semiconductor device according to an embodiment, FIG. 14B is a cross-sectional view taken along line x-x' in FIG. 14A, and FIG. 14C is a cross-sectional view taken along line y-y' in FIG. 14A.

FIG. 15A is a plan view related to the method for producing a semiconductor device according to an embodiment, FIG. 15B is a cross-sectional view taken along line x-x' in FIG. 15A, and FIG. 15C is a cross-sectional view taken along line y-y' in FIG. 15A.

FIG. 16A is a plan view related to the method for producing a semiconductor device according to an embodiment, FIG. 16B is a cross-sectional view taken along line x-x' in FIG. 16A, and FIG. 16C is a cross-sectional view taken along line y-y' in FIG. 16A.

FIG. 17A is a plan view related to the method for producing a semiconductor device according to an embodiment, FIG. 17B is a cross-sectional view taken along line x-x' in FIG. 17A, and FIG. 17C is a cross-sectional view taken along line y-y' in FIG. 17A.

FIG. 18A is a plan view related to the method for producing a semiconductor device according to an embodiment, FIG. 18B is a cross-sectional view taken along line x-x' in FIG. 18A, and FIG. 18C is a cross-sectional view taken along line y-y' in FIG. 18A.

FIG. 19A is a plan view related to the method for producing a semiconductor device according to an embodiment, FIG. 19B is a cross-sectional view taken along line x-x' in FIG. 19A, and FIG. 19C is a cross-sectional view taken along line y-y' in FIG. 19A.

FIG. 20A is a plan view related to the method for producing a semiconductor device according to an embodiment, FIG. 20B is a cross-sectional view taken along line x-x' in FIG. 20A, and FIG. 20C is a cross-sectional view taken along line y-y' in FIG. 20A.

FIG. 21A is a plan view related to the method for producing a semiconductor device according to an embodiment, FIG. 21B is a cross-sectional view taken along line x-x' in FIG. 21A, and FIG. 21C is a cross-sectional view taken along line y-y' in FIG. 21A.

FIG. 22A is a plan view related to the method for producing a semiconductor device according to an embodiment, FIG. 22B is a cross-sectional view taken along line x-x' in FIG. 22A, and FIG. 22C is a cross-sectional view taken along line y-y' in FIG. 22A.

FIG. 25A is a plan view related to the method for producing a semiconductor device according to an embodiment, FIG. 25B is a cross-sectional view taken along line x-x' in FIG. 25A, and FIG. 25C is a cross-sectional view taken along line y-y' in FIG. 25A.

FIG. 27A is a plan view related to the method for producing a semiconductor device according to an embodiment, FIG. 27B is a cross-sectional view taken along line x-x' in FIG. 27A, and FIG. 27C is a cross-sectional view taken along line y-y' in FIG. 27A.

FIG. 28A is a plan view related to the method for producing a semiconductor device according to an embodiment, FIG. 28B is a cross-sectional view taken along line x-x' in FIG. 28A, and FIG. 28C is a cross-sectional view taken along line y-y' in FIG. 28A.

FIG. 29A is a plan view related to the method for producing a semiconductor device according to an embodiment, FIG. 29B is a cross-sectional view taken along line x-x' in FIG. 29A, and FIG. 29C is a cross-sectional view taken along line y-y' in FIG. 29A.

FIG. 30A is a plan view related to the method for producing a semiconductor device according to an embodiment, FIG. 30B is a cross-sectional view taken along line x-x' in FIG. 30A, and FIG. 30C is a cross-sectional view taken along line y-y' in FIG. 30A.

FIG. 31A is a plan view related to the method for producing a semiconductor device according to an embodiment, FIG. 31B is a cross-sectional view taken along line x-x' in FIG. 31A, and FIG. 31C is a cross-sectional view taken along line y-y' in FIG. 31A.

FIG. 35A is a plan view related to the method for producing a semiconductor device according to an embodiment, FIG. 35B is a cross-sectional view taken along line x-x' in FIG. 35A, and FIG. 35C is a cross-sectional view taken along line y-y' in FIG. 35A.

FIG. 36A is a plan view related to the method for producing a semiconductor device according to an embodiment, FIG. 36B is a cross-sectional view taken along line x-x' in FIG. 36A, and FIG. 36C is a cross-sectional view taken along line y-y' in FIG. 36A.

FIG. 37A is a plan view related to the method for producing a semiconductor device according to an embodiment, FIG. 37B is a cross-sectional view taken along line x-x' in FIG. 37A, and FIG. 37C is a cross-sectional view taken along line y-y' in FIG. 37A.

FIG. 39A is a plan view related to the method for producing a semiconductor device according to an embodiment, FIG. 39B is a cross-sectional view taken along line x-x' in FIG. 39A, and FIG. 39C is a cross-sectional view taken along line y-y' in FIG. 39A.

FIG. 40A is a plan view related to the method for producing a semiconductor device according to an embodiment, FIG. 40B is a cross-sectional view taken along line x-x' in FIG. 40A, and FIG. 40C is a cross-sectional view taken along line y-y' in FIG. 40A.

FIG. 41A is a plan view related to the method for producing a semiconductor device according to an embodiment, FIG. 41B is a cross-sectional view taken along line x-x' in FIG. 41A, and FIG. 41C is a cross-sectional view taken along line y-y' in FIG. 41A.

FIG. 42A is a plan view related to the method for producing a semiconductor device according to an embodiment, FIG. 42B is a cross-sectional view taken along line x-x' in FIG. 42A, and FIG. 42C is a cross-sectional view taken along line y-y' in FIG. 42A.

DETAILED DESCRIPTION OF THE PREFERRED EMBODIMENTS

Steps for producing an SGT structure according to an embodiment of the present invention will now be described with reference to FIGS. 2A to 42C.

Described first is a first step of forming a fin-shaped semiconductor layer on a semiconductor substrate and forming a first insulating film around the fin-shaped semiconductor layer. In this embodiment, a silicon substrate is used as the semiconductor substrate but a substrate composed of any other semiconductor may be used instead.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. Although a resist mask is used to form a fin-shaped silicon layer in this embodiment, a hard mask such as an oxide film or a nitride film may be used instead.

Figure 4A:
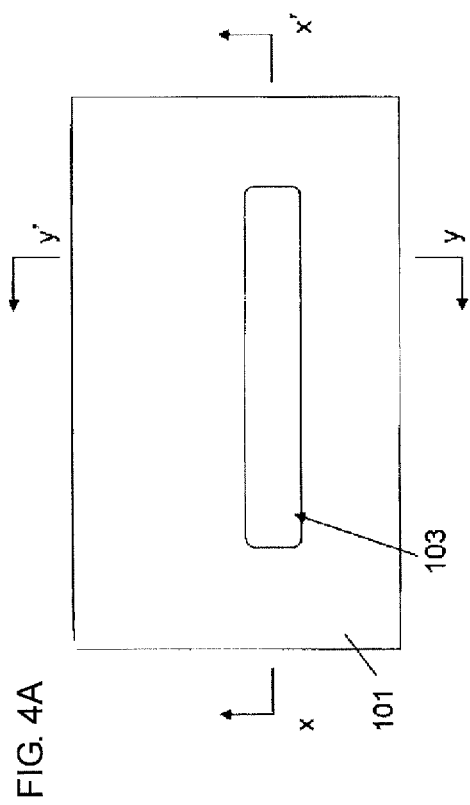
FIG. 4A is a plan view related to the method for producing a semiconductor device according to an embodiment.
Figure 4C:
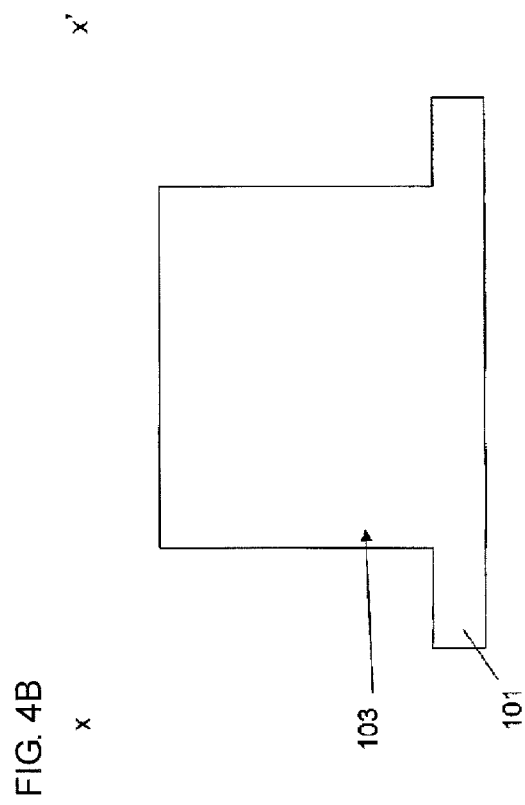
FIG. 4C is a cross-sectional view taken along line y-y' in FIG. 4A.
Figure 4B:
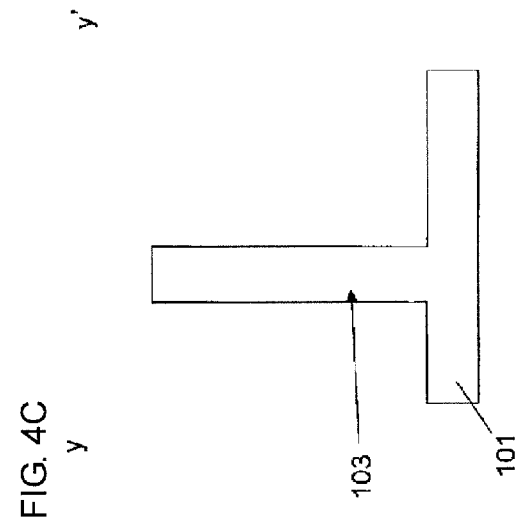
FIG. 4B is a cross-sectional view taken along line x-x' in FIG. 4A.

As illustrated in FIGS. 4A to 4C, the first resist 102 is removed.

As illustrated in FIGS. 5A to 5C, a first insulating film 104 is deposited around the fin-shaped silicon layer 103. An oxide film formed by high-density plasma or an oxide film formed by low-pressure chemical vapor deposition (CVD) may be used as the first insulating film 104.

Figure 6A:
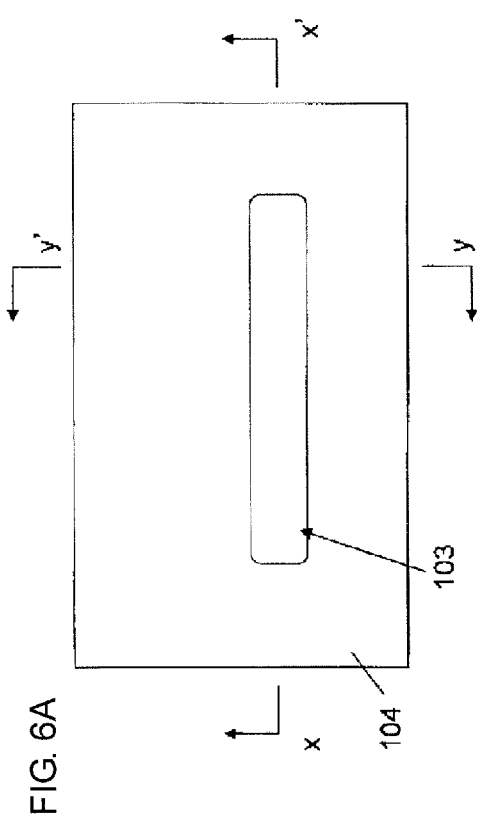
FIG. 6A is a plan view related to the method for producing a semiconductor device according to an embodiment.
Figure 6C:
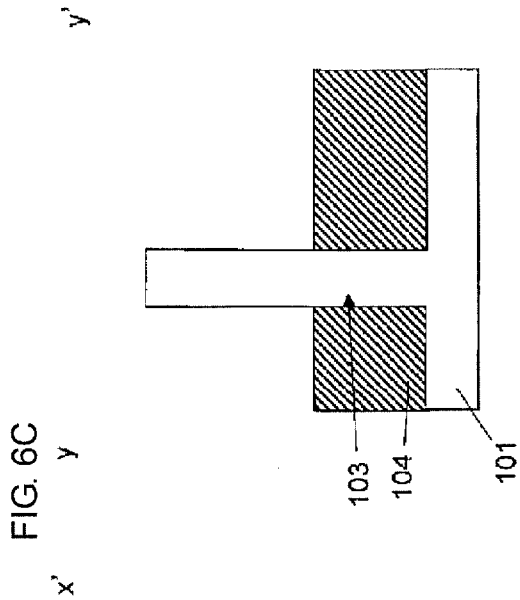
FIG. 6C is a cross-sectional view taken along line y-y' in FIG. 6A.
Figure 6B:
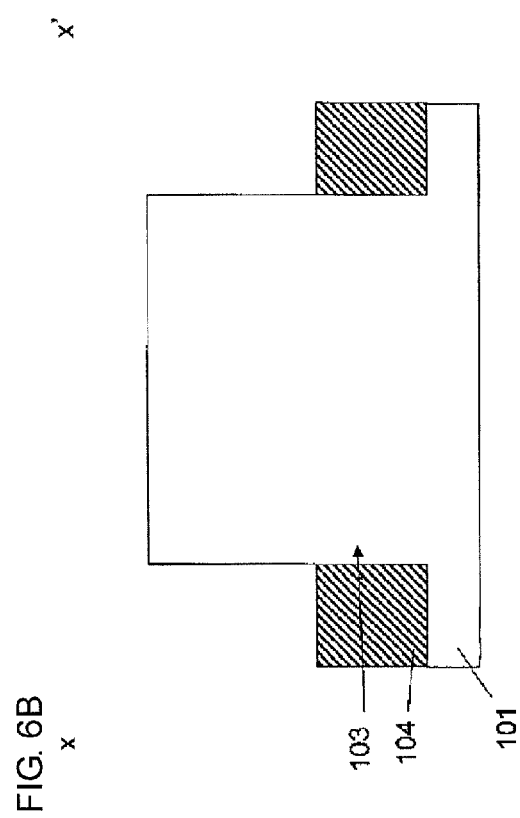
FIG. 6B is a cross-sectional view taken along line x-x' in FIG. 6A.

As illustrated in FIGS. 6A to 6C, the first insulating film 104 is etched back to expose an upper portion of the fin-shaped silicon layer 103. The steps up to here are the same as those of a method for making a fin-shaped silicon layer described in IEDM 2010 C C. Wu, et. al, 27.1.1-27.1.4.

The description up to here has shown a first step of forming a fin-shaped silicon layer 103 on a silicon substrate 101 and forming a first insulating film 104 around the fin-shaped silicon layer 103.

Described next is a second step that includes forming a second insulating film around the fin-shaped semiconductor layer, depositing a first polysilicon on the second insulating film to conduct planarization, forming a second resist for forming a gate line and a pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a pillar-shaped semiconductor layer and a first dummy gate formed of the first polysilicon.

Figure 7A:
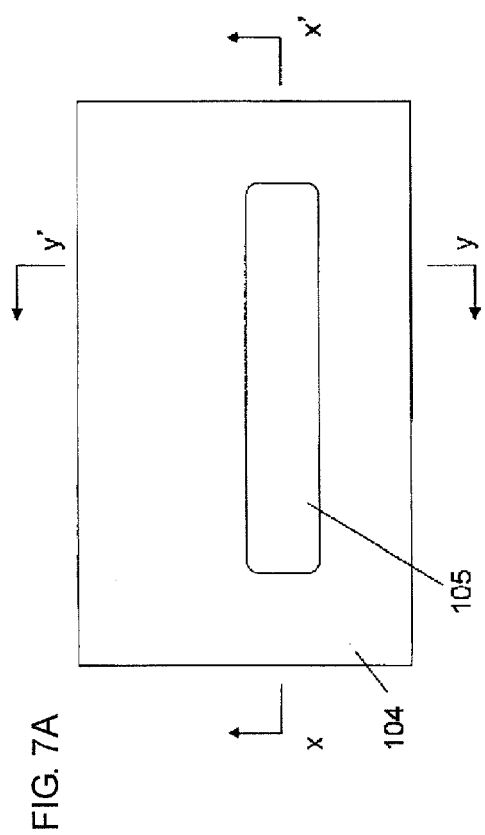
FIG. 7A is a plan view related to the method for producing a semiconductor device according to an embodiment.
Figure 7C:
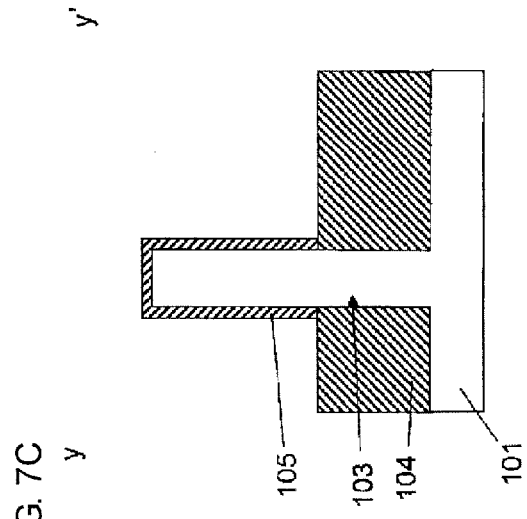
FIG. 7C is a cross-sectional view taken along line y-y' in FIG. 7A.
Figure 7B:
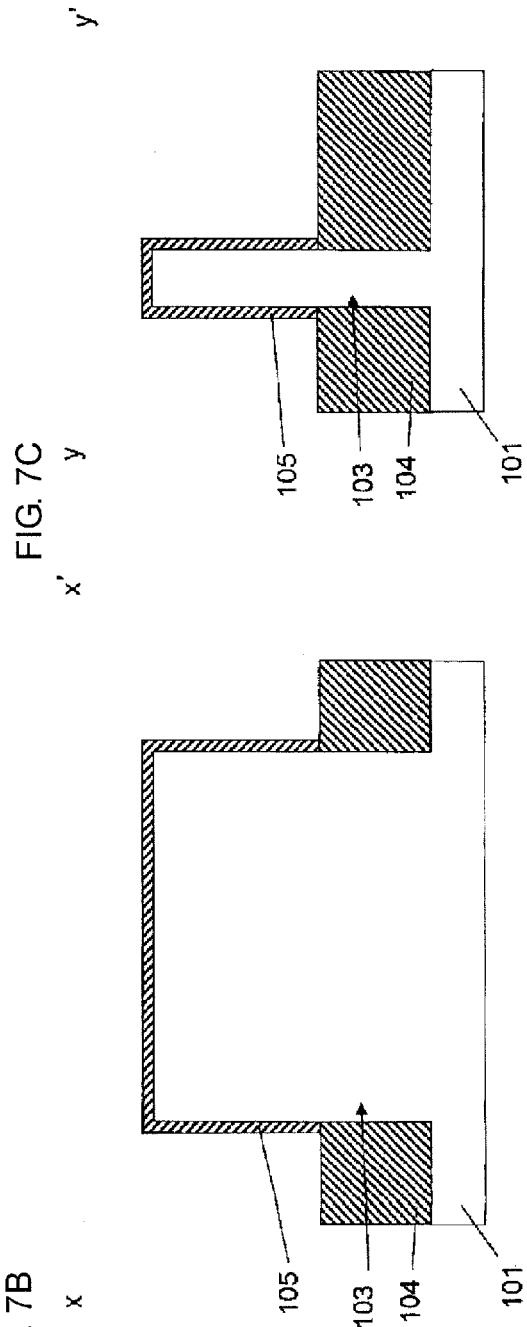
FIG. 7B is a cross-sectional view taken along line x-x' in FIG. 7A.

As illustrated in FIGS. 7A to 7C a second insulating film 105 is formed around the fin-shaped silicon layer 103. The second insulating film 105 is preferably an oxide film.

Figure 8C:
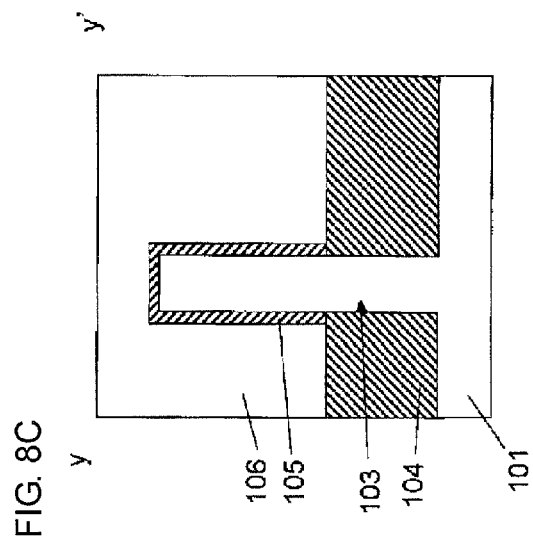
FIG. 8C is a cross-sectional view taken along line y-y' in FIG. 8A.
Figure 8A:
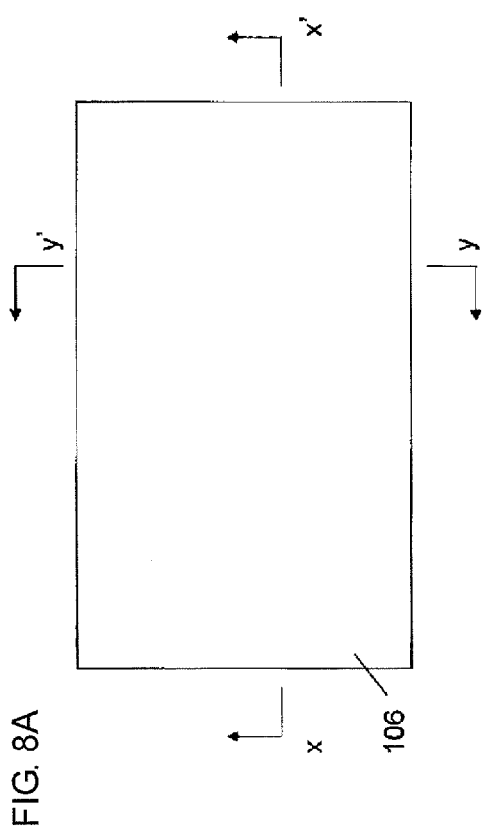
FIG. 8A is a plan view related to the method for producing a semiconductor device according to an embodiment.
Figure 8B:
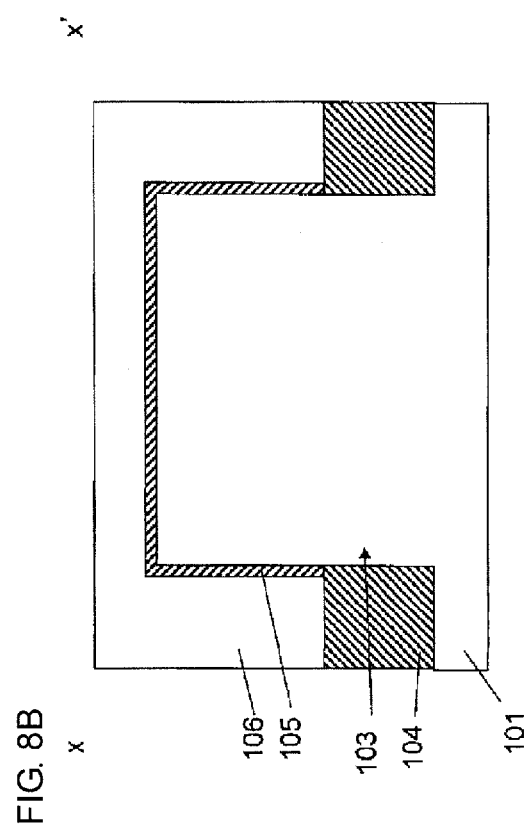
FIG. 8B is a cross-sectional view taken along line x-x' in FIG. 8A.

As illustrated in FIGS. 8A to 8C, a first polysilicon 106 is deposited on the second insulating film 105 to conduct planarization.

Figure 9A:
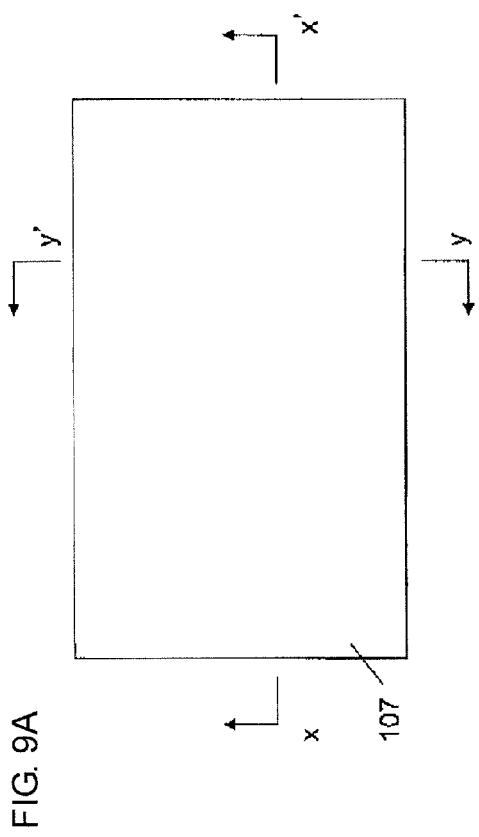
FIG. 9A is a plan view related to the method for producing a semiconductor device according to an embodiment.
Figure 9C:
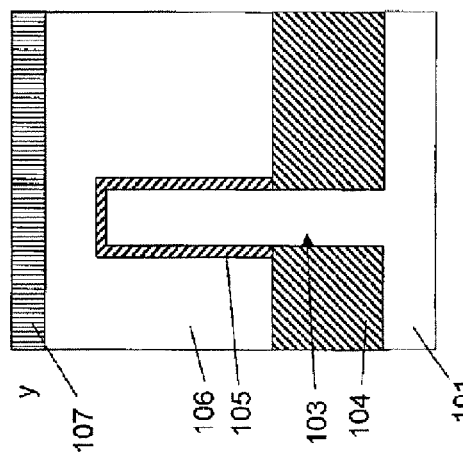
FIG. 9C is a cross-sectional view taken along line y-y' in FIG. 9A.
Figure 9B:
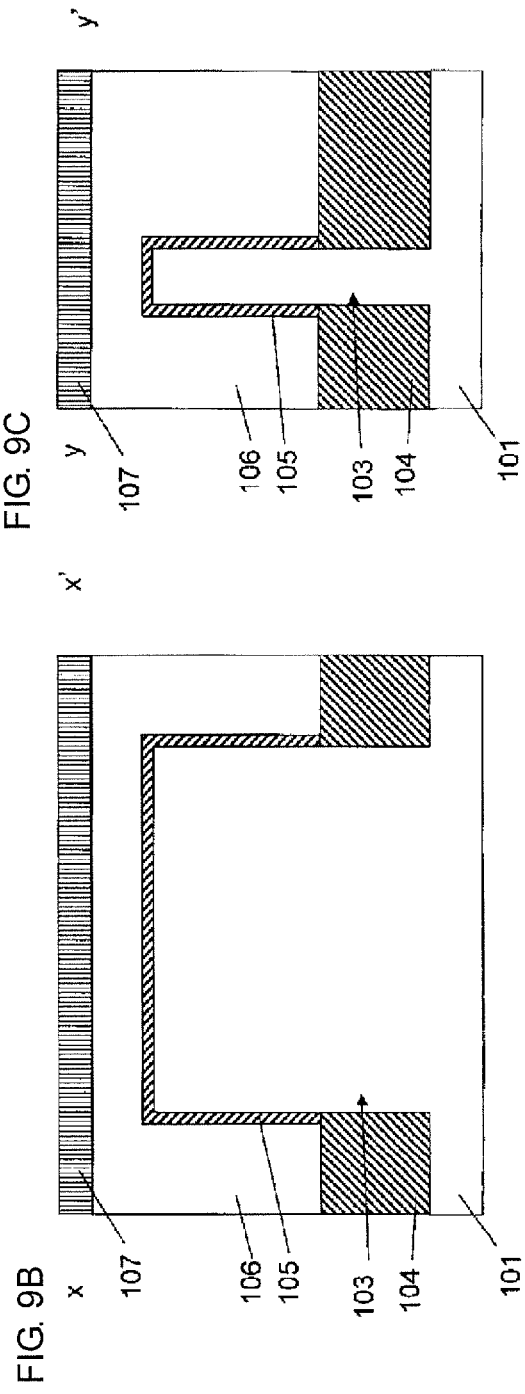
FIG. 9B is a cross-sectional view taken along line x-x' in FIG. 9A.

As illustrated in FIGS. 9A to 9C, a third insulating film 107 is formed on the first polysilicon 106. The third insulating film 107 is preferably a nitride film.

As illustrated in FIGS. 10A to 10C, a second resist 108 for forming a gate line and a pillar-shaped silicon layer is formed so as to extend in a direction perpendicular to the direction in which the fin-shaped silicon layer 103 extends.

As illustrated in FIGS. 11A to 11C, the third insulating film 107, the first polysilicon 106, the second insulating film 105, and the fin-shaped silicon layer 103 are etched to form a pillar-shaped silicon layer 109 and a first dummy gate 106 formed of the first polysilicon. If the second resist is removed by etching, the third insulating film 107 serves as a hard mask. If the second resist remains during etching, the third insulating film is not necessarily used.

As illustrated in FIGS. 12A to 12C, the second resist 108 is removed.

The description up to here has shown a second step that includes forming a second insulating film around the fin-shaped semiconductor layer, depositing a first polysilicon on the second insulating film to conduct planarization, forming a second resist for forming a gate line and a pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a pillar-shaped semiconductor layer and a first dummy gate formed of the first polysilicon.

Described next is a third step that follows the second step and includes forming a fourth insulating film around the pillar-shaped semiconductor layer and the first dummy gate, depositing a second polysilicon around the fourth insulating film, and performing etching so that the second polysilicon remains on side walls of the first dummy gate and the pillar-shaped semiconductor layer and forms a second dummy gate.

As illustrated in FIGS. 13A to 13C, a fourth insulating film 110 is formed around the pillar-shaped silicon layer 109 and the first dummy gate 106. The fourth insulating film 110 is preferably an oxide film.

As illustrated in FIGS. 14A to 14C, a second polysilicon 113 is deposited around the fourth insulating film 110.

As illustrated in FIGS. 15A to 15C, the second polysilicon 113 is etched so that the second polysilicon 113 remains on the side walls of the first dummy gate 106 and the pillar-shaped silicon layer 109 and forms a second dummy gate 113.

The description up to here has shown third step that follows the second step and includes forming a fourth insulating film around the pillar-shaped semiconductor layer and the first dummy gate, depositing a second polysilicon around the fourth insulating film, and performing etching so that the second polysilicon remains on side walls of the first dummy gate and the pillar-shaped semiconductor layer and forms a second dummy gate.

Described next is a fourth step that includes forming a fifth insulating film around the second dummy gate, etching the fifth insulating film into a side wall shape so as to form a side wall formed of the fifth insulating film, forming a second diffusion layer in an upper portion of the fin-shaped semiconductor layer and a lower portion of the pillar-shaped semiconductor layer, and forming a metal-semiconductor compound on the second diffusion layer.

As illustrated in FIGS. 16A to 16C, a fifth insulating film 114 is formed around the second dummy gate 113. The fifth insulating film 114 is preferably a nitride film.

As illustrated in FIGS. 17A to 17C, the fifth insulating film 114 is etched into a side wall shape. As a result, a side wall 114 formed of the fifth insulating film is formed.

As illustrated in FIGS. 18A to 18C, an impurity is introduced to form a second diffusion layer 115 in an upper portion of the fin-shaped silicon layer 103 and a lower portion of the pillar-shaped silicon layer 109. Arsenic or phosphorus is preferably introduced to form an n-type diffusion layer. Boron is preferably introduced to form a p-type diffusion layer. Introduction of the impurity may be performed before formation of the fifth insulating film.

As illustrated in FIGS. 19A to 19C, a metal-semiconductor compound 116 is formed on the second diffusion layer 115. A metal-semiconductor compound 117 is also formed in an upper portion of the second dummy gate 113 during this process.

The description up to here has shown a fourth step that includes forming a fifth insulating film around the second dummy gate, etching the fifth insulating film into a side wall shape so as to form a side wall formed of the fifth insulating film, forming a second diffusion layer in an upper portion of the fin-shaped semiconductor layer and a lower portion of the pillar-shaped semiconductor layer, and forming a metal-semiconductor compound on the second diffusion layer.

Described next is a fifth step following the fourth step, the fifth step including depositing an interlayer insulating film and performing chemical mechanical polishing to expose an upper portion of the second dummy gate and an upper portion of the first dummy gate, removing the second dummy gate and the first dummy gate, removing the second insulating film and the fourth insulating film, forming a first gate insulating film around the pillar-shaped semiconductor layer and on inner sides of the fifth insulating film, depositing a first metal, and performing etch-back to form a gate electrode and a gate line.

As illustrated in FIGS. 20A to 20C, a contact stopper film 118 is deposited and an interlayer insulating film 119 is deposited. The contact stopper film 118 is preferably a nitride film. There is no need to use a contact stopper film if etching of the contact holes can be controlled.

As illustrated in FIGS. 21A to 21C, chemical mechanical polishing is performed to expose an upper portion of the second dummy gate 113 and an upper portion of the first dummy gate 106. During this process, the metal-semiconductor compound 117 formed in the upper portion of the second dummy gate 113 is removed.

As illustrated in FIGS. 22A to 22C, the second dummy gate 113 and the first dummy gate 106 are removed.

Figure 23C:
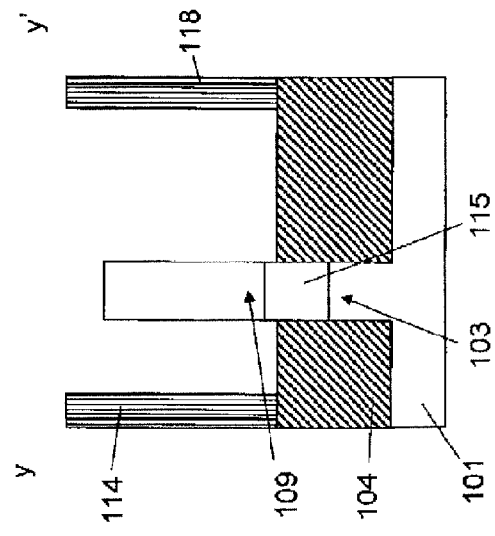
FIG. 23C is a cross-sectional view taken along line y-y' in FIG. 23A.
Figure 23A:
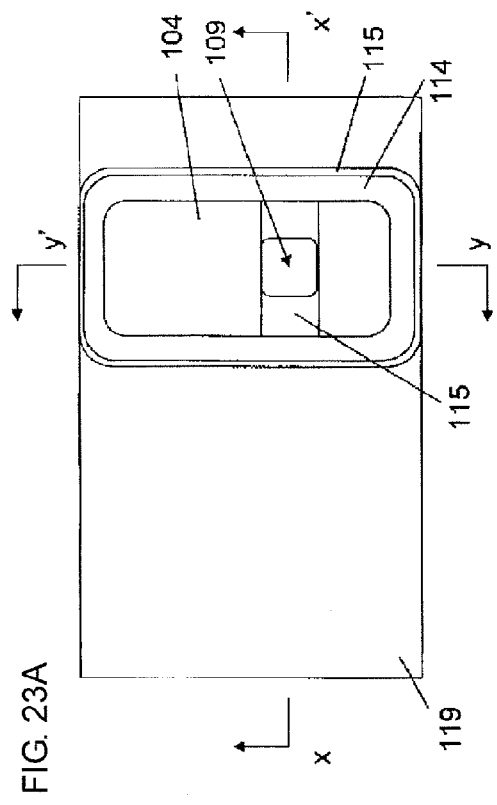
FIG. 23A is a plan view related to the method for producing a semiconductor device according to an embodiment.
Figure 23B:
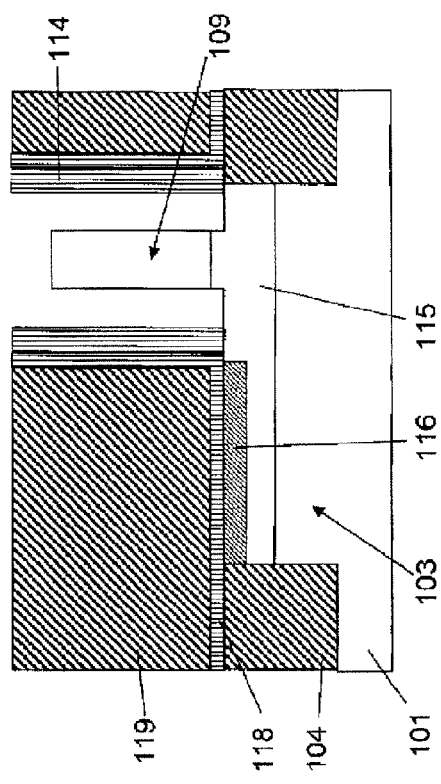
FIG. 23B is a cross-sectional view taken along line x-x' in FIG. 23A.

As illustrated in FIGS. 23A to 23C, the second insulating film 105 and the fourth insulating film 110 are removed.

Figure 24A:
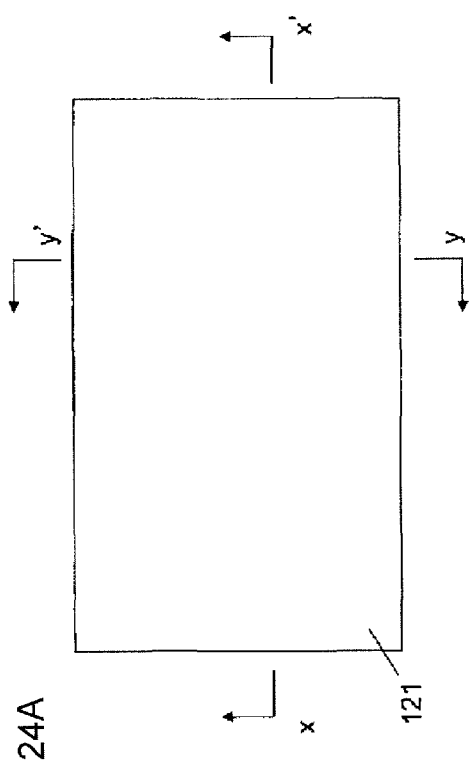
FIG. 24A is a plan view related to the method for producing a semiconductor device according to an embodiment.
Figure 24C:
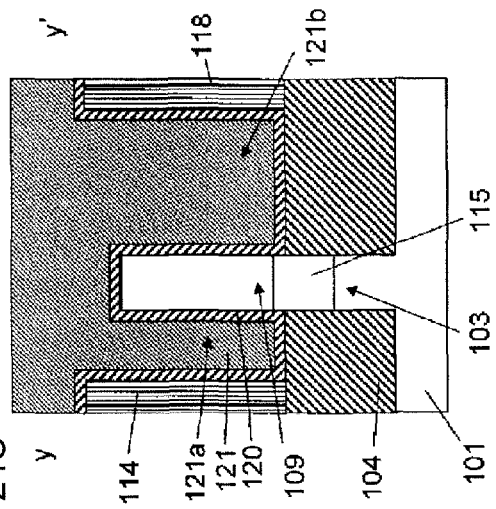
FIG. 24C is a cross-sectional view taken along line y-y' in FIG. 24A.
Figure 24B:
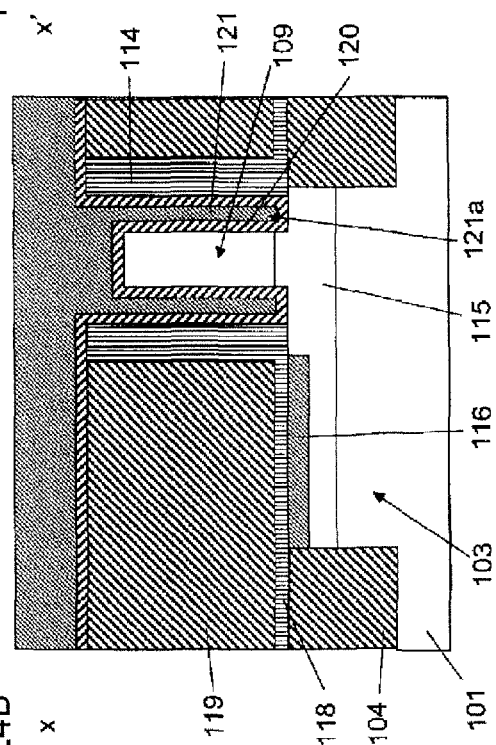
FIG. 24B is a cross-sectional view taken along line x-x' in FIG. 24A.

As illustrated in FIGS. 24A to 24C, a first gate insulating film 120 is formed around the pillar-shaped silicon layer 109 and on inner sides of the fifth insulating film 114, and a first metal 121 is deposited. A gate electrode 121a is formed around the pillar-shaped silicon layer 109. A gate line 121b is also formed. Since the first gate insulating film 120 is formed around and at bottoms of the gate electrode 121a and the gate line 121b, the gate electrode 121a and the gate line 121b can be insulated from the pillar-shaped silicon layer 109 and the fin-shaped silicon layer 103.

As illustrated in FIGS. 25A to 25C, the first metal 121 is etched back to expose an upper portion of the pillar-shaped silicon layer 109.

The description up to here has shown a fifth step following the fourth step, the fifth step including depositing an interlayer insulating film and performing chemical mechanical polishing to expose an upper portion of the second dummy gate and an upper portion of the first dummy gate, removing the second dummy gate and the first dummy gate, removing the second insulating film and the fourth insulating film, forming a first gate insulating film around the pillar-shaped semiconductor layer and on inner sides of the fifth insulating film, depositing a first metal, and performing etch-back to form a gate electrode and a gate line.

Described next is a sixth step following the fifth step, the sixth step including depositing a sixth insulating film, forming a third resist for forming a contact hole on the pillar-shaped semiconductor layer, etching the sixth insulating film to form a contact hole on the pillar-shaped semiconductor layer, removing the third resist, depositing a second gate insulating film, depositing a second metal, performing etch-back, removing the second gate insulating film that lies on the pillar-shaped semiconductor layer so as to form a metal side wall on a side wall of an upper portion of the pillar-shaped semiconductor layer, and depositing a third metal to form a contact that connects an upper portion of the metal side wall and the upper portion of the pillar-shaped semiconductor layer.

Figure 26A:
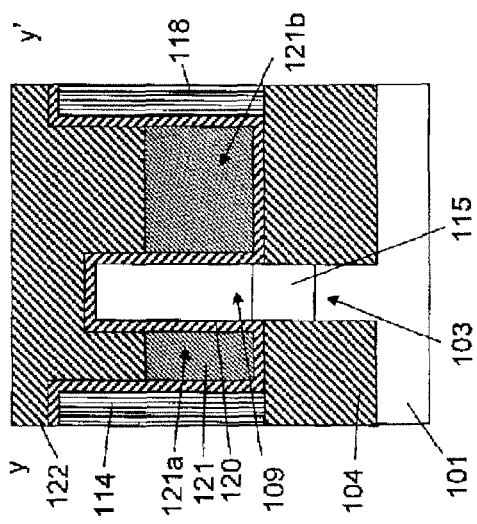
FIG. 26A is a plan view related to the method for producing a semiconductor device according to an embodiment.
Figure 26B:
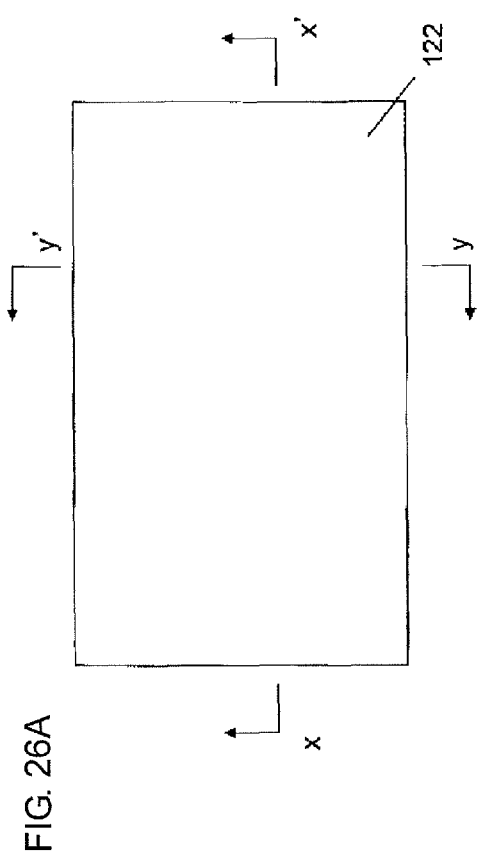
FIG. 26B is a cross-sectional view taken along line x-x' in FIG. 26A.
Figure 26C:
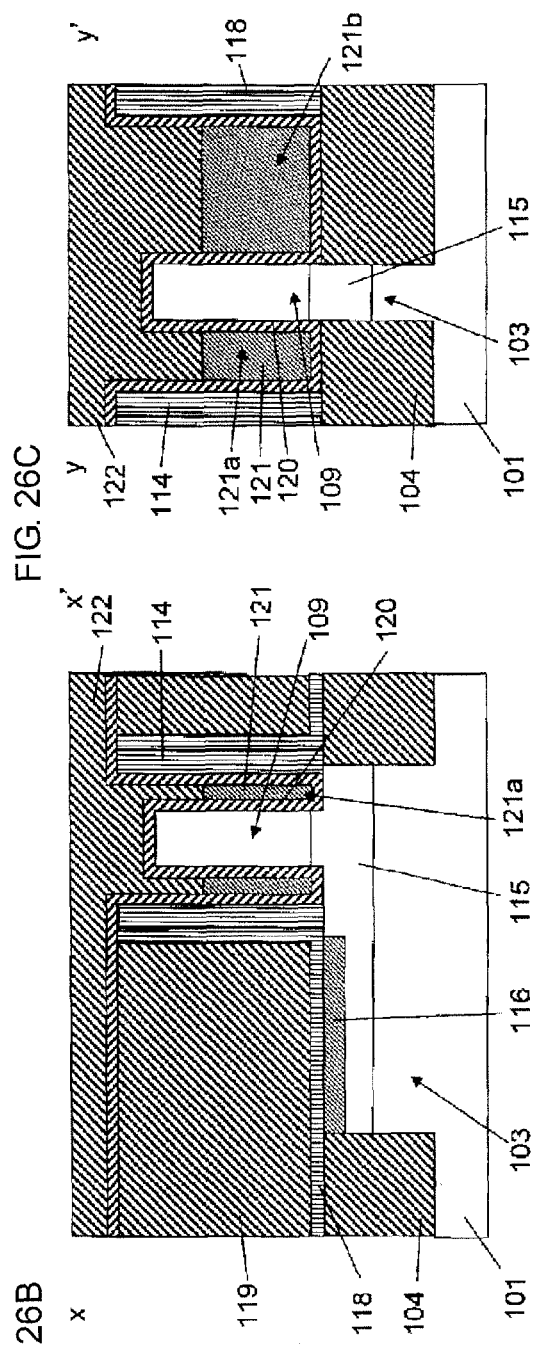
FIG. 26C is a cross-sectional view taken along line y-y' in FIG. 26A.

As illustrated in FIGS. 26A to 26C, a sixth insulating film 122 is deposited. The sixth insulating film 122 is preferably an oxide film.

As illustrated in FIGS. 27A to 27C, a third resist 123 for forming a contact hole 124 on the pillar-shaped silicon layer 109 is formed.

As illustrated in FIGS. 28A to 28C, the sixth insulating film 122 is etched to form a contact hole 124 on the pillar-shaped silicon layer 109.

As illustrated in FIGS. 29A to 29C, the third resist 123 is removed.

As illustrated in FIGS. 30A to 30C, the exposed part of the first gate insulating film 120 is removed.

As illustrated in FIGS. 31A to 31C, a second gate insulating film 125 is deposited.

Figure 32A:
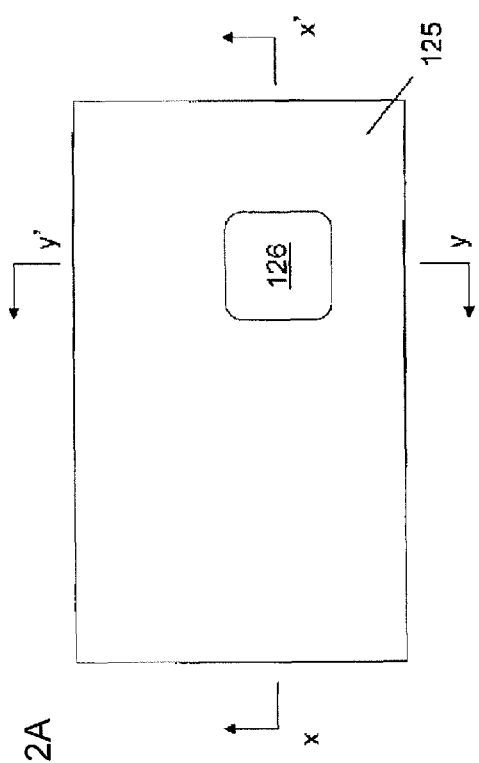
FIG. 32A is a plan view related to the method for producing a semiconductor device according to an embodiment.
Figure 32C:
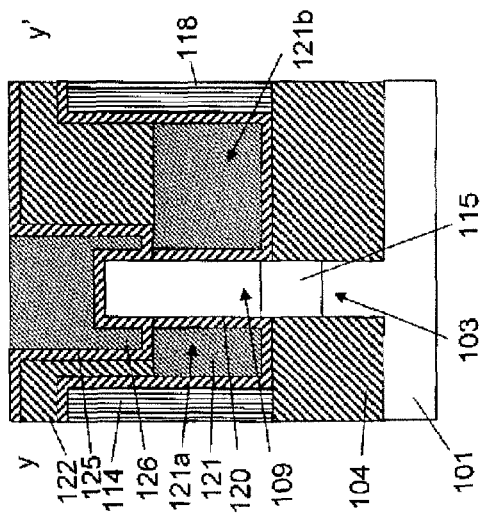
FIG. 32C is a cross-sectional view taken along line y-y' in FIG. 32A.
Figure 32B:
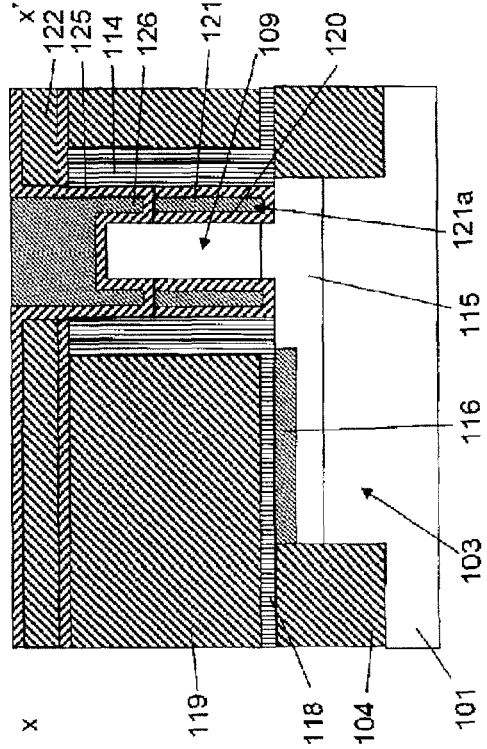
FIG. 32B is a cross-sectional view taken along line x-x' in FIG. 32A.

As illustrated in FIGS. 32A to 32C, a second metal 126 is deposited. Even when the gate electrode and the gate line have come to be exposed after formation of the contact hole by etching, the second gate insulating film 125 insulates the second metal 126 from the gate electrode 121a and the gate line 121b. The work function of the second metal 126 is preferably in the range of 4.0 eV to 4.2 eV if the transistor is of an n-type and is preferably in the range of 5.0 eV to 5.2 eV if the transistor is of a p-type.

Figure 33A:
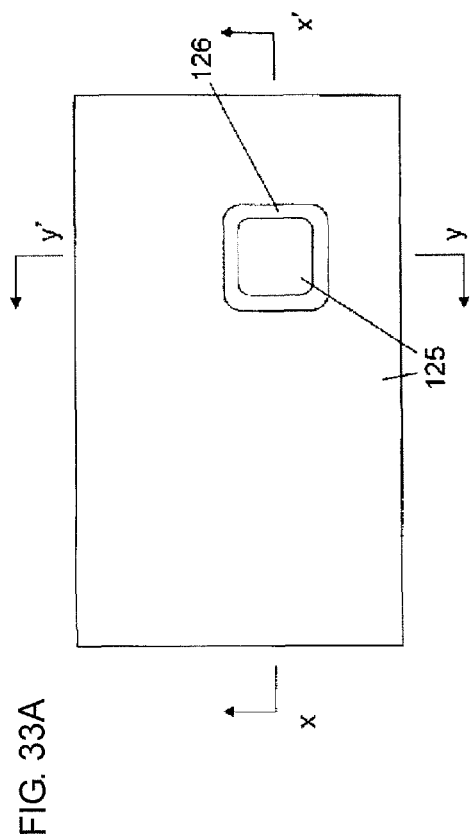
FIG. 33A is a plan view related to the method for producing a semiconductor device according to an embodiment.
Figure 33C:
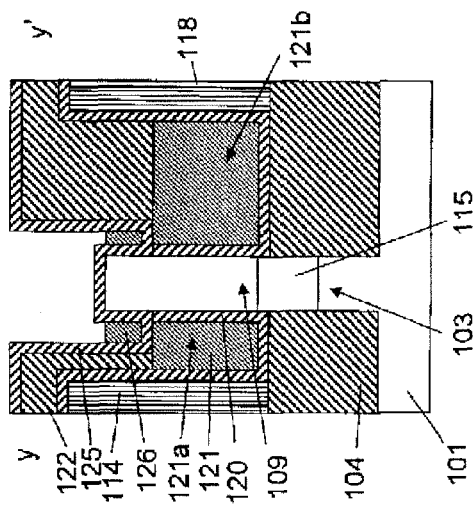
FIG. 33C is a cross-sectional view taken along line y-y' in FIG. 33A.
Figure 33B:
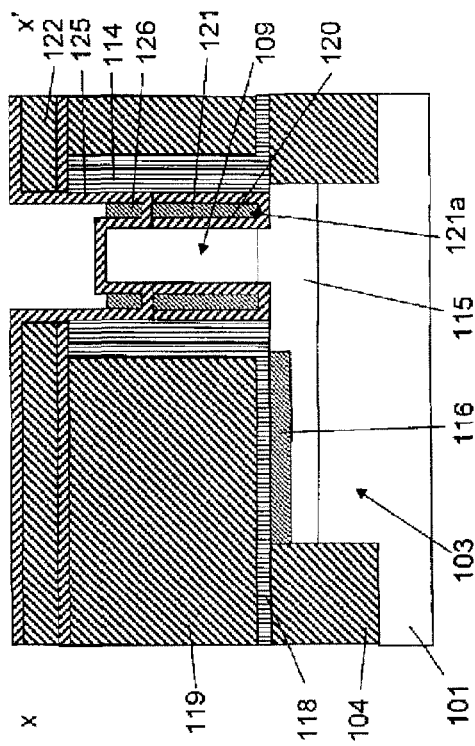
FIG. 33B is a cross-sectional view taken along line x-x' in FIG. 33A.

As illustrated in FIGS. 33A to 33C, an upper portion of the pillar-shaped silicon layer 109 is exposed by etching back the second metal 126.

Figure 34A:
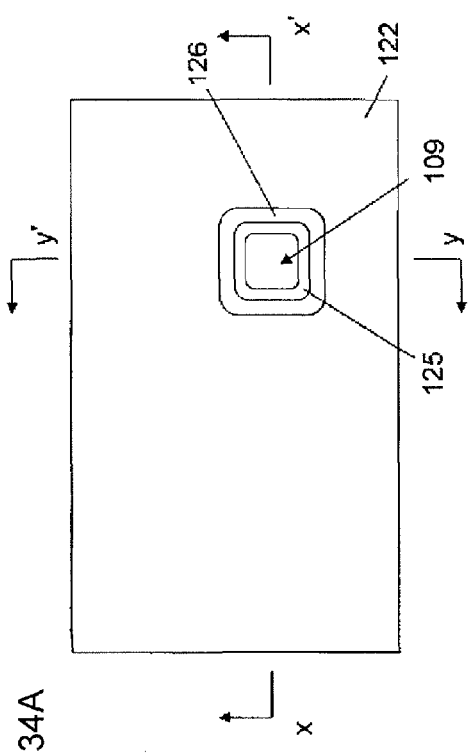
FIG. 34A is a plan view related to the method for producing a semiconductor device according to an embodiment.
Figure 34C:
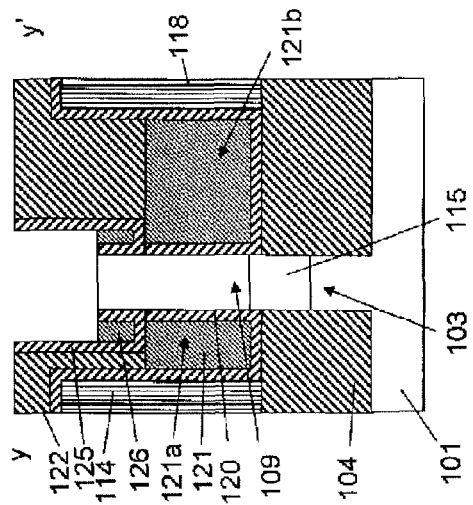
FIG. 34C is a cross-sectional view taken along line y-y' in FIG. 34A.
Figure 34B:
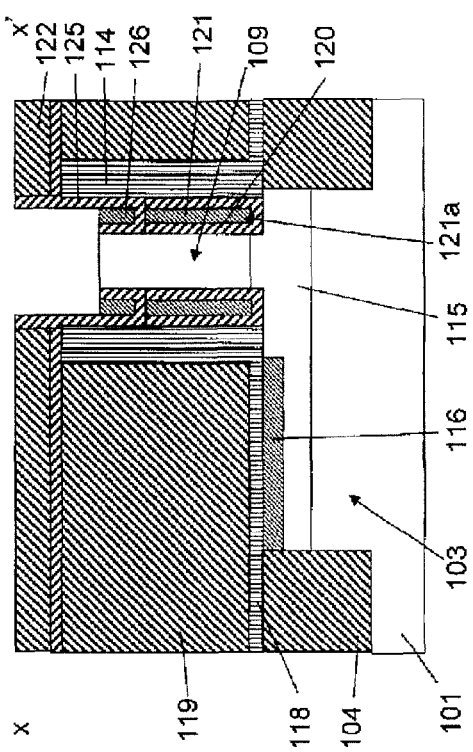
FIG. 34B is a cross-sectional view taken along line x-x' in FIG. 34A.

As illustrated in FIGS. 34A to 34C, the second gate insulating film 125 on the pillar-shaped silicon layer 109 is removed so as to form a metal side wall 126 on a side wall of an upper portion of the pillar-shaped silicon layer 109.

As illustrated in FIGS. 35A to 35C, a third metal 127 is deposited to form a contact 127 that connects an upper portion of the metal side wall 126 and an upper portion of the pillar-shaped silicon layer 109. As a result, although no diffusion layer is formed in the upper portion of the pillar-shaped silicon layer 109, the upper portion of the pillar-shaped silicon layer 109 can serve as an n-type silicon layer or a p-type silicon layer depending on the difference in work function between the second metal and silicon. Accordingly, a step of forming a diffusion layer in the upper portion of the pillar-shaped silicon layer 109 can be omitted.

The description up to here has shown a sixth step following the fifth step, the sixth step including depositing a sixth insulating film, forming a third resist for forming a contact hole on the pillar-shaped semiconductor layer, etching the sixth insulating film to form a contact hole on the pillar-shaped semiconductor layer, removing the third resist, depositing a second gate insulating film, depositing a second metal, performing etch-back, removing the second gate insulating film that lies on the pillar-shaped semiconductor layer so as to form a metal side wall on a side wall of an upper portion of the pillar-shaped semiconductor layer, and depositing a third metal to form a contact that connects an upper portion of the metal side wall and the upper portion of the pillar-shaped semiconductor layer.

As illustrated in FIGS. 36A to 36C, a fourth resist 128 for forming contact holes is formed.

As illustrated in FIGS. 37A to 37C, the sixth insulating film 122, the first gate insulating film 120, the interlayer insulating film 119, and the contact stopper film 118 are etched to form contact holes 129 and 130.

Figure 38A:
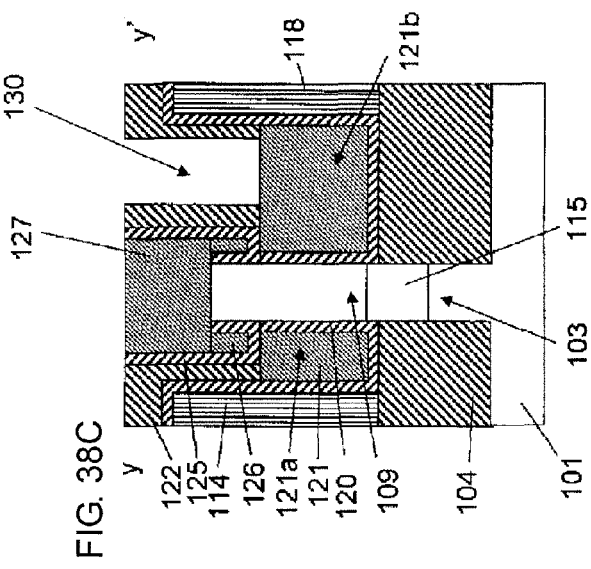
FIG. 38A is a plan view related to the method for producing a semiconductor device according to an embodiment.
Figure 38B:
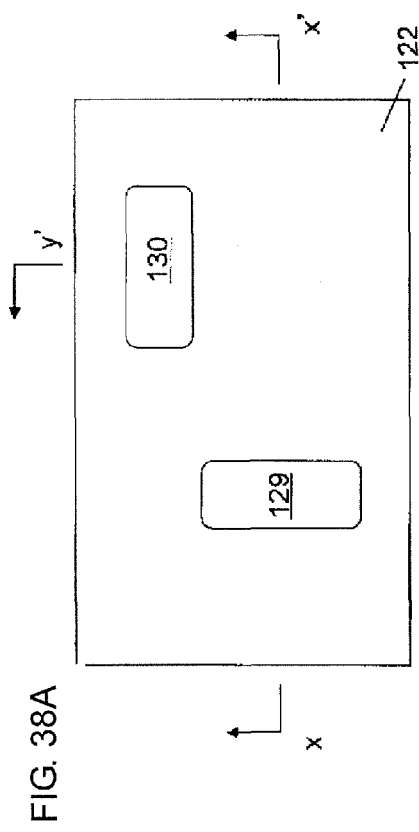
FIG. 38B is a cross-sectional view taken along line x-x' in FIG. 38A.
Figure 38C:
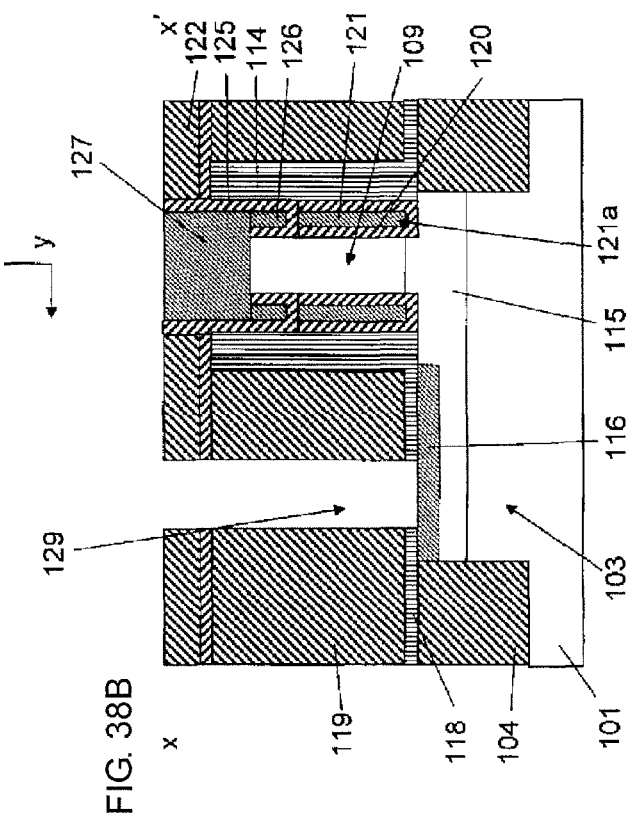
FIG. 38C is a cross-sectional view taken along line y-y' in FIG. 38A.

As illustrated in FIGS. 38A to 38C, the fourth resist 128 is removed.

As illustrated in FIGS. 39A to 39C, a metal 131 is deposited to form contacts 132 and 133.

As illustrated in FIGS. 40A to 40C, fifth resists 134, 135, and 136 for forming metal wiring are formed.

As illustrated in FIGS. 41A to 41C, the metal 131 is etched to form metal wiring 137, 138, and 139.

As illustrated in FIGS. 42A to 42C, the fifth resists 134, 135, and 136 are removed.

The description above has shown a method for producing an SGT through a gate-last process involving forming a fin-shaped semiconductor layer, a pillar-shaped semiconductor layer, a gate electrode, and a gate line by using two masks, in which an upper portion of the pillar-shaped semiconductor layer serves as an n-type semiconductor layer or a p-type semiconductor layer depending on the difference in work function between the metal and semiconductor.

Figure 1A:
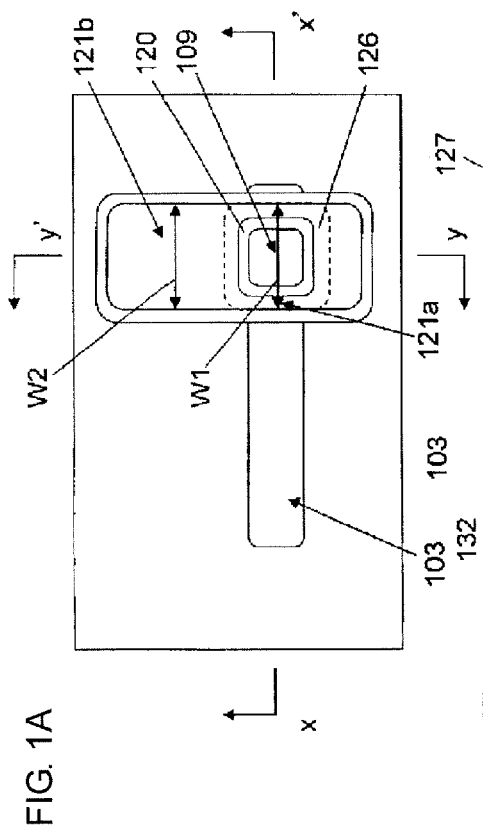
FIG. 1A is a plan view of a semiconductor device according to an embodiment.
Figure 1C:
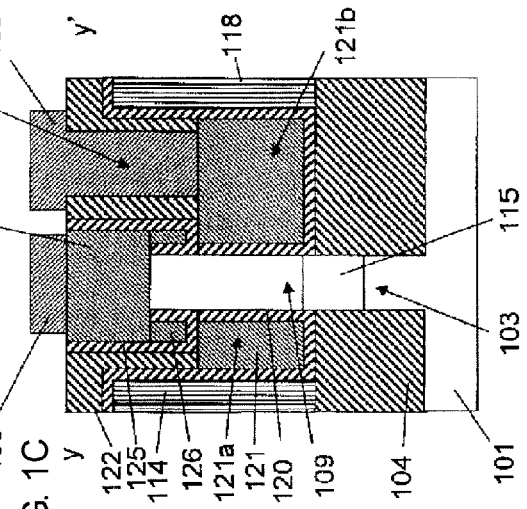
FIG. 1C is a cross-sectional view taken along line y-y' in FIG. 1A.
Figure 1B:
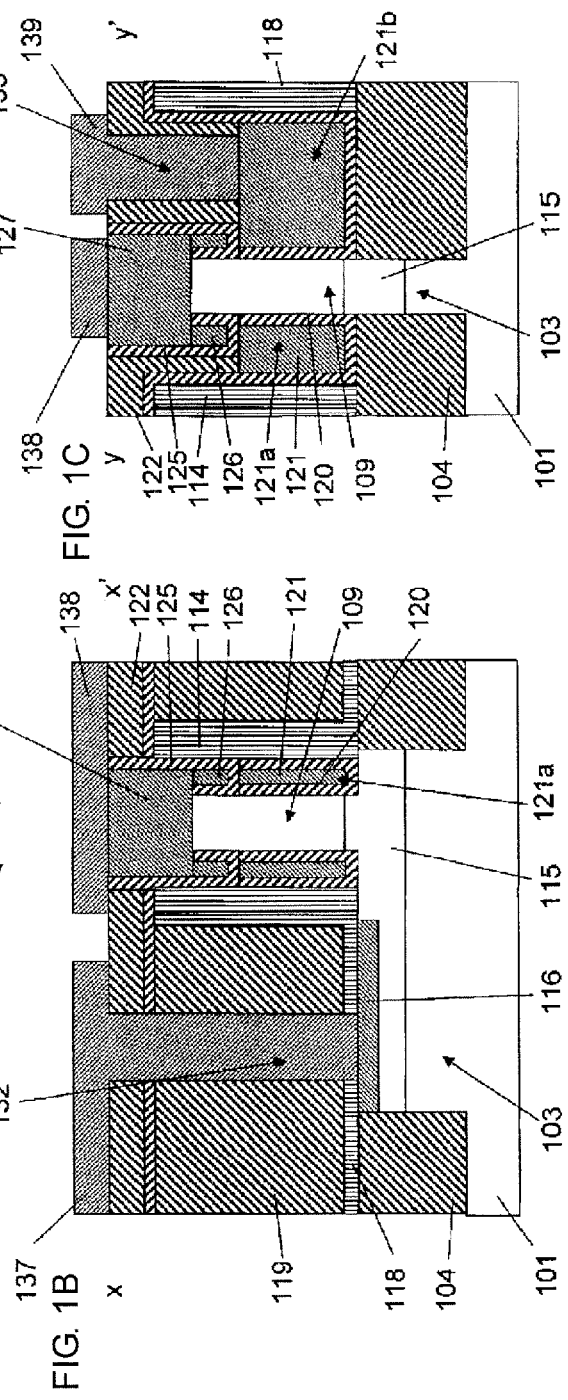
FIG. 1B is a cross-sectional view taken along line x-x' in FIG. 1A.

FIGS. 1A to 1C illustrate a structure of a semiconductor device obtained by the production method described above.

The semiconductor device includes a fin-shaped silicon layer 103 disposed on a silicon substrate 101, a first insulating film 104 disposed around the fin-shaped silicon layer 103, a pillar-shaped silicon layer 109 disposed on the fin-shaped silicon layer 103, a first gate insulating film 120 disposed around the pillar-shaped silicon layer 109, a gate electrode 121a disposed around the first gate insulating film 120 and formed of a metal, a gate line 121b connected to the gate electrode 121a and formed of a metal extending in a direction perpendicular to a direction in which the fin-shaped silicon layer 103 extends, a second diffusion layer 115 disposed in an upper portion of the fin-shaped silicon layer 103 and a lower portion of the pillar-shaped silicon layer 109, a second gate insulating film 125 disposed around a side wall of an upper portion of the pillar-shaped silicon layer 109, a metal side wall 126 disposed around the second gate insulating film 125, and a contact 127 that connects an upper portion of the metal side wall 126 to an upper portion of the pillar-shaped silicon layer 109. A width of the pillar-shaped silicon layer 109 in a direction perpendicular to a direction in which the fin-shaped silicon layer 103 extends is equal to a width of the fin-shaped silicon layer 103 in the direction perpendicular to the direction in which the fin-shaped silicon layer 103 extends. The first gate insulating film 120 is disposed around and at bottoms of gate electrode 121a and the gate line 121b. An outer width of the gate electrode 121a is equal to a width of the gate line 121b.

In the present invention, a diffusion layer is not formed in an upper portion of the pillar-shaped silicon layer 109 but the upper portion of the pillar-shaped silicon layer 109 can serve as an n-type silicon layer or a p-type silicon layer depending on the difference in work function between the second metal 126 and silicon. Accordingly, the step of forming a diffusion layer in an upper portion of a pillar-shaped silicon layer can be omitted.

When the work function of the second metal 126 is in the range of 4.0 eV to 4.2 eV, the upper portion of the pillar-shaped silicon layer 109 serves as an n-type silicon since this work function is close to that of an n-type silicon, which is 4.05 eV. The second metal 126 is preferably a compound between tantalum and titanium (TaTi) or tantalum nitride (TaN).

When the work function of the second metal 126 is in the range of 5.0 eV to 5.2 eV, the upper portion of the pillar-shaped silicon layer 109 serves as a p-type silicon layer since this work function is close to that of a p-type silicon, which is 5.15 eV. The second metal 126 is preferably ruthenium (Ru) or titanium nitride (TiN).

The first gate insulating film 120 formed around and at bottoms of the gate electrode 121a and the gate line 121b insulates the gate electrode 121a and the gate line 121b from the pillar-shaped silicon layer 109 and the fin-shaped silicon layer 103.

The second gate insulating film 125 formed around and at the bottom of the metal side wall 126 insulates the gate electrode 121a and the gate line 121b from the metal side wall 126 even when the gate electrode 121a and the gate line 121b have come to be exposed after formation of contact holes by etching since the second gate insulating film 125 is formed after the etching.

Misalignment between the pillar-shaped silicon layer 109 and the gate line 121b can be eliminated since they are formed by self-alignment.

Various other embodiments and modifications are possible without departing from the scope and spirit of the present invention in a broad sense. The embodiments described above are merely illustrative and do not limit the scope of the present invention.

For example, the technical scope of the present invention naturally includes a method for producing a semiconductor device in which the conductivity types, p (including p$^+$) and n (including n$^+$), are reversed from the embodiments described above, and a semiconductor device obtained through the method.

What is claimed is:

1. A semiconductor device comprising:
   a fin-shaped semiconductor layer disposed on a semiconductor substrate;
   a first insulating film disposed around the fin-shaped semiconductor layer;
   a pillar-shaped semiconductor layer disposed on the fin-shaped semiconductor layer;
   a first gate insulating film disposed around the pillar-shaped semiconductor layer;
   a gate electrode formed of a metal disposed around the first gate insulating film;
   a gate line connected to the gate electrode and formed of a metal that extends in a direction perpendicular to a direction in which the fin-shaped semiconductor layer extends;
   a second diffusion layer disposed in an upper portion of the fin-shaped semiconductor layer and a lower portion of the pillar-shaped semiconductor layer;
   a second gate insulating film disposed around a side wall of an upper portion of the pillar-shaped semiconductor layer;
   a metal side wall disposed around the second gate insulating film; and
   a contact that connects an upper portion of the metal side wall to an upper portion of the pillar-shaped semiconductor layer,
   wherein a width of the pillar-shaped semiconductor layer in a direction perpendicular to a direction in which the fin-shaped semiconductor layer extends is equal to a width of the fin-shaped semiconductor layer in the direction perpendicular to the direction in which the fin-shaped semiconductor layer extends, the first gate insulating film is disposed around and at bottoms of the gate electrode and the gate line, and an outer width of the gate electrode is equal to a width of the gate line.

2. The semiconductor device according to claim 1, further comprising:

a second gate insulating film disposed around and at a bottom of the metal side wall.

3. The semiconductor device according to claim 1, wherein a metal that forms the metal side wall has a work function in the range of 4.0 eV to 4.2 eV.

4. The semiconductor device according to claim 1, wherein a metal that forms the metal side wall has a work function in the range of 5.0 eV to 5.2 eV.

* * * * *